(12) United States Patent
Salter et al.

(10) Patent No.: US 6,272,040 B1
(45) Date of Patent: Aug. 7, 2001

(54) SYSTEM AND METHOD FOR PROGRAMMING A MAGNETORESISTIVE MEMORY DEVICE

(75) Inventors: Eric J. Salter, Scottsdale, AZ (US); John P. Hansen, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/675,204

(22) Filed: Sep. 29, 2000

(51) Int. Cl.$^7$ .................................................. G11C 11/00
(52) U.S. Cl. ........................ 365/158; 365/171; 365/173; 365/225.5
(58) Field of Search ...................... 365/158, 171, 365/173, 55, 145, 225.5

(56) References Cited

U.S. PATENT DOCUMENTS

| | | | |
|---|---|---|---|
| 5,654,566 | * 8/1997 | Johnson | 257/295 |
| 5,734,605 | * 3/1998 | Zhu et al. | 365/173 |
| 5,978,257 | * 11/1999 | Zhu et al. | 365/173 |
| 6,163,477 | * 12/2000 | Tran | 365/173 |

* cited by examiner

Primary Examiner—David Nelms
Assistant Examiner—Gene N. Auduong
(74) Attorney, Agent, or Firm—James L. Clingan, Jr.

(57) ABSTRACT

A system and method for programming a magnetoresistive memory array by applying current on a memory line aligned along the easy axis of the memory array, where the current generates a magnetic field that is independently sufficient to program at least two multi-state magnetoresistive memory elements coupled along the memory line. The memory array may be organized as one or more column memory lines along the easy axis and one or more row memory lines along a hard axis. In this configuration, the column drive circuitry includes a current source for each column memory line that is capable of programming all of the memory elements along the respective column memory line. Each column current source may assert a lesser or medium current level that generates a magnetic field that is insufficient alone to program the logic state of any memory element in the memory array. The medium current level, however, is sufficient to program each memory element along the corresponding column memory line when the memory element is also coupled along a row memory line that also receives a medium level current from a corresponding row current source. Each column current source may be one multi-state current source or may be several current sources to apply the appropriate programming current levels. The entire memory array may be programmed in one write operation by asserting an appropriate current level on each column and row memory line.

11 Claims, 17 Drawing Sheets

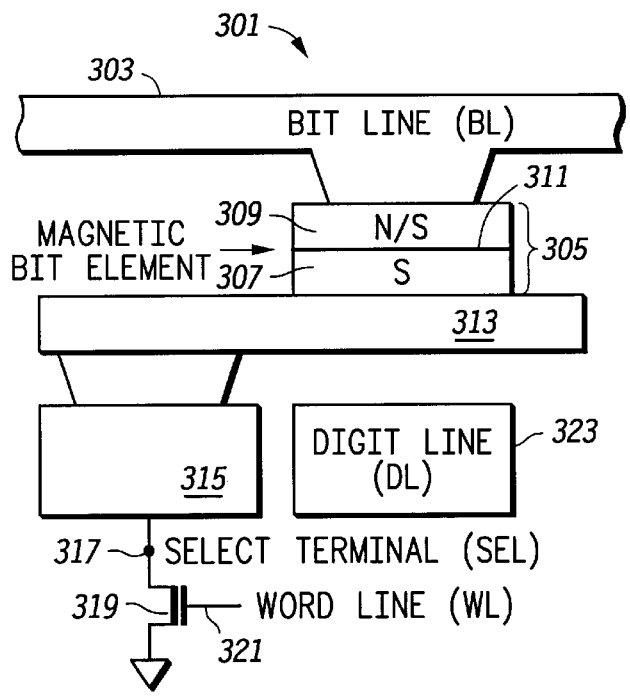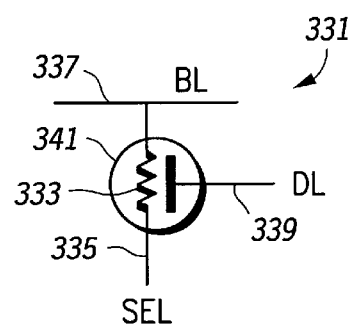
*FIG.3A*
*FIG.3B*
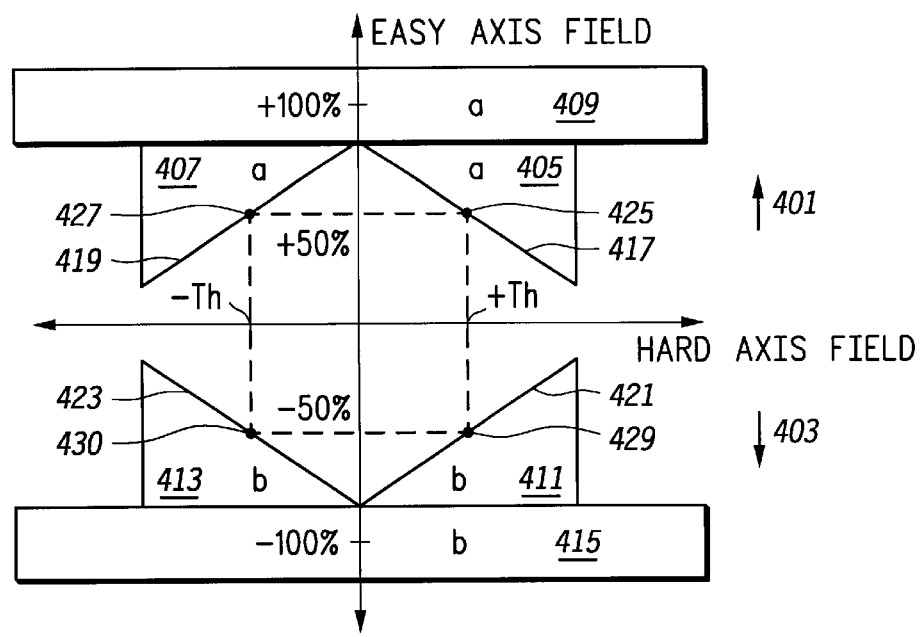
*FIG.4A*

FIG.15B

|  | ROW ADDRESS | | | | | | | | |
|---|---|---|---|---|---|---|---|---|---|
|  |  | 000 | 001 | 010 | 011 | 100 | 101 | 110 | 111 |  |
| COLUMN ADDRESS | 000 | 1 | 1 | 1 | 1 | 1 | 1 | 1 | 1 | $I_{CX}$ |
|  | 001 | 1 | 1 | 1 | 1 | 1 | 1 | 1 | 1 | $I_{CX}$ |
|  | 010 | 1 | 1 | 1 | 1 | 1 | 1 | 1 | 1 | $I_{CX}$ |
|  | 011 | 1 | 1 | 1 | 0 | 0 | 0 | 0 | 0 | $I_{CM}$ |
|  | 100 | 0 | 0 | 0 | 0 | 0 | 0 | 0 | 0 | $I_{CL}$ |
|  | 101 | 0 | 0 | 0 | 0 | 0 | 0 | 0 | 0 | $I_{CL}$ |
|  | 110 | 0 | 0 | 0 | 0 | 0 | 0 | 0 | 0 | $I_{CL}$ |
|  | 111 | 0 | 0 | 0 | 0 | 0 | 0 | 0 | 0 | $I_{CL}$ |
|  |  | $I_{RM}$ | $I_{RM}$ | $I_{RM}$ | $I_{RL}$ | $I_{RL}$ | $I_{RL}$ | $I_{RL}$ | $I_{RL}$ |  |

FIG.15C

|  | ROW ADDRESS | | | | | | | | |
|---|---|---|---|---|---|---|---|---|---|
|  |  | 000 | 001 | 010 | 011 | 100 | 101 | 110 | 111 |  |
| COLUMN ADDRESS | 000 | 1 | 1 | 1 | 1 | 1 | 1 | 1 | 1 | $I_{CX}$ |
|  | 001 | 1 | 1 | 1 | 1 | 1 | 1 | 1 | 1 | $I_{CX}$ |
|  | 010 | 1 | 1 | 1 | 1 | 1 | 1 | 1 | 1 | $I_{CX}$ |
|  | 011 | 1 | 1 | 0 | 0 | 0 | 0 | 0 | 0 | $I_{CL}$ |
|  | 100 | 1 | 0 | 0 | 0 | 0 | 0 | 0 | 0 | $I_{CM}$ |
|  | 101 | 0 | 0 | 0 | 0 | 0 | 0 | 0 | 0 | $I_{CL}$ |
|  | 110 | 0 | 0 | 0 | 0 | 0 | 0 | 0 | 0 | $I_{CL}$ |
|  | 111 | 0 | 0 | 0 | 0 | 0 | 0 | 0 | 0 | $I_{CL}$ |
|  |  | $I_{RM}$ | $I_{RL}$ | $I_{RL}$ | $I_{RL}$ | $I_{RL}$ | $I_{RL}$ | $I_{RL}$ | $I_{RL}$ |  |

SYSTEM AND METHOD FOR PROGRAMMING A MAGNETORESISTIVE MEMORY DEVICE

RELATED APPLICATIONS

This is related to United States Patent Applications:

patent application Ser. No. 09/675,183, John P. Hansen and Eric J. Salter (Our Ref: MOTR:0003) entitled "An Analog to Digital Converter Using Magnetoresistive Memory Technology", patent application Ser. No. 09/675,181, now U.S. Pat. No. 6,225,933, Eric J. Salter and John P. Hansen (Our Ref: MOTR:0004) entitled "A Digital to Analog Converter Using Magnetoresistive Memory Technology", patent application Ser. No. 09/675,203, John P. Hansen and Eric J. Salter (Our Ref: MOTR:0005) entitled "A Programmable Resistive Circuit Using Magnetoresistive Memory Technology", patent application Ser. No. 09/675,182, Eric J. Salter and John P. Hansen (Our Ref: MOTR:0010) entitled "A Programmable Oscillator Using Magnetoresistive Memory Technology", and patent application Ser. No. 09/675,202, John P. Hansen and Eric J. Salter (Our Ref: MOTR:0012) entitled "An Analog Functional Module Using Magnetoresistive Memory Technology", all of which are filed concurrently herewith and assigned to the assignee hereof.

FIELD OF THE INVENTION

The present invention relates to magnetoresistive memory technology, and more particularly to a system and method for programming a magnetoresistive memory array by applying a current on a memory line aligned along the easy axis of the memory array, where the current generates a magnetic field that is independently sufficient to program two or more magnetoresistive memory elements coupled along the memory line.

RELATED ART

Magnetoresistive memory technology is currently being developed for memory devices such as magnetoresistive random access memory (MRAM) devices and the like. Integration of MRAM technology into complimentary metal oxide semiconductor (CMOS) is also currently being developed. Various MRAM technologies, fabricating methods, and related capabilities are described in various issued patents, including U.S. Pat. No. 5,940,319 entitled "Magnetic Random Access Memory and Fabricating Method Thereof", U.S. Pat. No. 5,732,016 entitled "Memory Cell Structure in a Magnetic Random Access Memory and a Method For Fabricating Thereof", and U.S. Pat. No. 5,703,805 entitled "Method For Detecting Information Stored in a MRAM Cell Having Two Magnetic Layers in Different Thicknesses", which are hereby incorporated by reference in their entirety.

In general, a magnetic memory element has a structure which includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions as information which are called "Parallel" and "Antiparallel" states, respectively. In response to Parallel and Antiparallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

MRAM technology is very versatile and cost effective and is intended to replace other memory types including FLASH-type memories, dynamic RAMS (DRAMs), static RAMs (SRAMs), etc. Memory devices are usually only part of an overall system which may further include processing devices, controllers, and various other analog functional modules and devices. The challenge is to incorporate MRAM technology in the most efficient and cost effective manner.

BRIEF DESCRIPTION OF THE DRAWINGS

The present invention is illustrated by way of example and not limitation in the accompanying figures, in which like references indicate similar elements, and in which:

FIG. 3A is a simplified cross-sectional side view of an exemplary structure of a single multi-state MRME.

FIG. 3B is a symbolic representation of the MRME of FIG. 3A.

FIG. 4A is a graph diagram illustrating the switching properties of the MRME of FIG. 3A.

FIG. 14 is a flow chart diagram illustrating a multiple step write operation of the DAC of FIG. 12 for programming its memory array.

FIGS. 15A and 15B are chart diagrams illustrating programming of the memory array of the DAC of FIG. 12 in accordance with the flow chart of FIG. 14.

FIG. 15C is a chart diagram illustrating an alternative embodiment of programming of the memory array of the DAC of FIG. 12 in accordance with the flow chart of FIG. 14.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. The letter "b" immediately following a number indicates that the number is represented in its binary or base two form.

The basic building block of magnetoresistive memory technology is a multi-state magnetoresistive memory element (MRME) or a memory cell that exhibits programmable resistive characteristics. In particular, an MRME has a memory characteristic in that it may be switched between at least two resistive values and thus may be utilized in MRAMs. It has been recognized, as described further below, that MRMEs may also be used as the primary building block for various analog functional components implemented in functional modules. As described further below, a plurality of MRMEs may be configured into a stacked array to create a programmable resistive element, a programmable voltage source, a programmable current source, an analog-to-digital converter (ADC), a digital-to-analog converter (DAC), a phase lock loop (PLL) and various other analog functionalities. In this manner, MRMEs enable any analog functional module implemented using magnetoresistive memory technology to be combined into a system using other modules implemented according any type of technology including magnetoresistive memory technology. Such capability provides significant versatility to designers of functions, devices or systems implemented on integrated circuits (ICs), chips, multi-chip modules, printed circuit boards (PCBs), etc.

Figure 1:
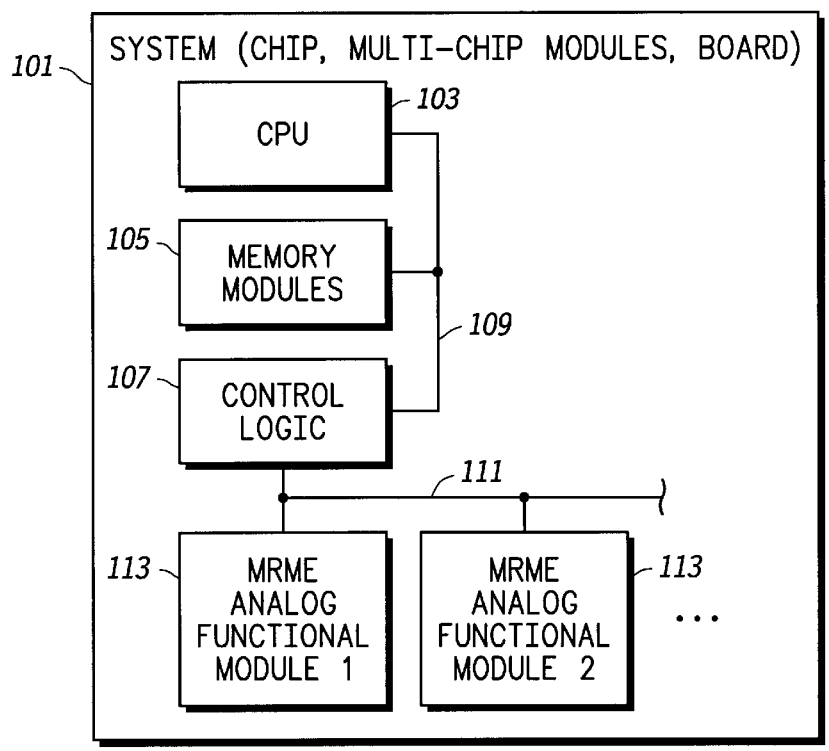
FIG. 1 is a block diagram of a system using magnetoresistive memory technology including magnetoresistive memory elements (MRMEs) configured as one or more analog functional modules, and further including one or more other logic modules implemented using magnetoresistive memory technology or other manufacturing technologies.

FIG. 1 is a block diagram of a system 101 implemented in any desired fashion, such as on a single integrated circuit (IC) or chip, a multi-chip module configuration, or a PCB level configuration, such as a system board, a multi-chip board, a plug-in upgrade module board, or any other expansion-type or peripheral boards such as Input/Output (I/O) boards commonly utilized in computer systems. The system 101 as shown includes a plurality of logic modules, such as a central processing unit (CPU) 103, one or more memory modules 105, and control logic 107 coupled via a common processor bus 109. The control logic 107 is further coupled to a system bus 111, which is further coupled to one or more MRME analog functional modules 113 implemented utilizing magnetoresistive memory technology, each for performing a respective analog function. The system components 103–113 are coupled together to perform any desired function or process. Only two MRME analog functional modules 113 are shown, individually labeled module 1 and module 2, although it is understood that less than or more than two modules may be utilized in the system 101. Any one or more of the CPU 103, the memory modules 105, or the control logic 107 may also be implemented using utilizing magnetoresistive memory technology. For example, the memory modules 105 may comprise magnetoresistive memory such as one or more MRAM memory chips.

It is appreciated that the system 101 may be implemented on a single integrated circuit utilizing magnetoresistive memory technology, where the CPU 103, the memory modules 105, the control logic 107 and each of the MRME analog functional modules 113 are all implemented using utilizing magnetoresistive memory technology. In alternative embodiments, any of the CPU 103, the memory modules 105, and the control logic 107 may be implemented using utilizing magnetoresistive memory technology according to the same or a different manufacturing process. Further, any one or more of the CPU 103, the memory modules 105, and the control logic 107 may be implemented using any other known or developed manufacturing technology other than magnetoresistive memory technology on the same integrated circuit.

In another alternative embodiment, the system 101 comprises one or more multi-chip boards or modules, where the CPU 103, the memory modules 105, the control logic 107 and each of the MRME analog functional modules 113 are implemented utilizing separate modules that are integrated onto a single substrate. Again, each of the logic and module components may be implemented utilizing the same magnetoresistive memory technology or different technologies and may be implemented using the same or different manufacturing processes. Furthermore, the CPU 103, the memory modules 105, the control logic 107 and the MRME analog functional modules 113 may each be implemented on a separate integrated circuit or chip and mounted to a system or expansion board or the like as previously described.

Figure 2:
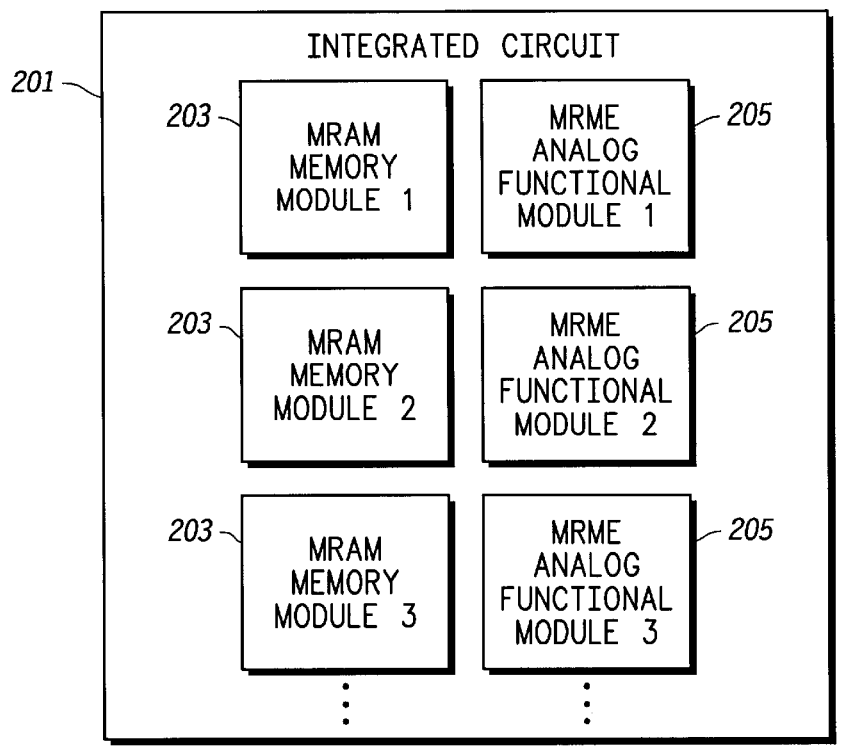
FIG. 2 is a block diagram of an integrated circuit using magnetoresistive memory technology, which further incorporates one or more MRAM memory modules and one or more MRME analog functional modules.

FIG. 2 is a block diagram of an integrated circuit 201 which further incorporates one or more MRAM memory modules 203 and one or more MRME analog functional modules 205. The modules 203, 205 are coupled together to perform any type of function or process as desired. The MRAM memory modules 203 are individually labeled modules 1, 2, 3, etc. where it is understood that any number of MRAM memory modules may be incorporated onto the integrated circuit 201 including less than or more than three. Also, the MRME analog functional modules 205 are individually labeled modules 1, 2, 3 where any number of analog functional modules may be utilized on the integrated circuit 201 such as less than or more than three. The MRAM memory modules 203 and the MRME analog functional modules 205 are all implemented utilizing magnetoresistive memory technology on the same integrated circuit 201. It is appreciated that the MRAM memory modules 203 may be implemented using the same or a different manufacturing process than the MRME analog functional modules 205. The use of the same manufacturing process provides an additional benefit of being cost effective in that the entire integrated circuit 201 including memory modules 203 and analog functional modules 205 may all be implemented concurrently utilizing the same manufacturing process.

FIG. 3A is a simplified cross-sectional side view of an exemplary structure of a single multi-state MRME 301. The MRME 301 includes a conductive line called a bit line (BL) terminal 303 placed within a predetermined distance or range of a magnetic bit element 305. The predetermined range depends upon the physical and electrical characteristics of the MRME 301, but generally denotes a switchable distance between the magnetic bit element 305 and the bit line terminal 303 so that a magnetic field established by current along the bit line terminal 303 is sufficient to switch or to otherwise assist in switching the magnetic bit element 305 into either of two logic states. The magnetic bit element 305 includes a fixed or pinned ferromagnetic layer forming a magnetic element 307 and a switchable or free ferromagnetic layer forming a magnetic element 309 separated by a thin non-magnetic substrate 311. The magnetic bit element 305 is mounted to a non-magnetic substrate 313, which is further mounted to a conductive pad 315. The pad 315 effectively establishes a conductive select (SEL) node or terminal 317.

The select terminal 317 may further be coupled to a transistor 319, such as a Metal Oxide Semiconductor Field Effect Transistor (MOSFET), a P-channel MOS (PMOS) transistor or an N-channel MOS (NMOS) transistor or the like, or any other suitable technology, such as bipolar technology and the like. The transistor 319 is referenced to ground and includes a base or gate terminal coupled to a conductive word line (WL) 321. A conductive digit line (DL) terminal 323 is shown within another predetermined range or distance of the magnetic bit element 305 and is a conductive line similar to the bit line terminal 303. The bit line terminal 303 and the digit line terminal 323 are conductive lines that are used to perform switching of the magnetic bit element 305 to thereby program or otherwise switch the MRME 301 between two different resistive states. The bit line terminal 303 and the digit line terminal 323 are conductive lines that are positioned substantially orthogonal with respect to each other to receive respective currents that generate magnetic fields utilized to switch the magnetic bit element 305. The predetermined range between the digit line terminal 323 and the magnetic bit element 305 also denotes a switchable distance so that a magnetic field established by current along the digit line terminal 323 is sufficient to switch or to otherwise assist in switching the magnetic bit element 305 into either of two resistive states.

Either the bit line terminal 303 or digit line terminal 323 may be configured as a hard axis terminal or as an easy axis terminal for switching the MRME 301 depending upon the particular configuration of the magnetic bit element 305. As shown, the pinned magnetic element 307 of the magnetic bit element 305 is labeled with an "S" denoting the "South" end of the magnetic element 307. The free magnetic element 309 is switchable relative to the pinned magnetic element 307 between "North" (Antiparallel) or "South" (parallel) positions denoted "N/S". In this configuration of the MRME 301, the i digit line terminal 323 is the hard axis terminal whereas the bit line terminal 303 is the easy axis terminal. In an alternative configuration, the bit line terminal 303 is configured as the hard axis terminal whereas the digit line terminal 323 is configured as the easy axis terminal where the pinned magnetic element 307 is implemented at an orthogonal position. The alternative configuration would be illustrated with an arrow pointing from left to right or from right to left depending upon its magnetic orientation. The free magnetic element 309 would thus be switchable between the left and right positions denoted with a double arrow pointing both to the left and right denoting the two separate programmable positions.

As described further below, the digit line terminal 323 and the bit line terminal 303 may be used in combination to switch the magnetic bit element 305, which effectively means switching the free magnetic element 309 between the North and South positions. In MRAM devices, a 50% current level may be applied along an easy axis field or "easy axis" through the easy axis terminal and at least a corresponding threshold current along a hard axis field or "hard axis" on the hard axis terminal to switch the magnetic bit element 305. A 50% current level denotes a relative current magnitude that develops a corresponding magnetic field that is insufficient, by itself, to switch the magnetic bit element 305. The 50% current level along the easy axis is sufficient to switch the magnetic bit element 305, however, when the threshold current level is applied along the hard axis. A 100% current level denotes a relative current magnitude that develops a corresponding magnetic field that is independently sufficient to switch the magnetic bit element 305 regardless of current along the hard axis. The direction of the current along the easy axis determines the programmed resistive state as one of two resistive states, which may be utilized to denote one of two logic states. The threshold current along the hard axis may be applied in either direction, and does not determine the state of the magnetic bit element 305.

More particularly for the MRME 301, the 50% current level is applied on the bit line terminal 303 and the threshold current level is applied on the digit line terminal 323. The current direction of the digit line terminal 323 may be in either direction (such as into the drawing page or out of the page in the structure shown in FIG. 3A). The direction of the current asserted through the bit line terminal 303 determines the state of the magnetic bit element 305. A 100% current from right to left on the bit line terminal 303 or a 50% current with application of at least a threshold current on the digit line terminal 323, causes the free magnetic element 309 to switch to the North magnetic orientation according to the right hand rule. An opposite current direction from left to right through the bit line terminal 303 switches the free magnetic element 309 to the South or the opposite magnetic orientation. The North magnetic orientation is one resistive state that may be defined as a particular logic state, such as logic one (1) or logic zero (0), whereas the South magnetic orientation is defined as the opposite logic state.

The relative magnetic orientations between the magnetic elements 307, 309 determine the resistive property through the magnetic bit element 305 as sensed between the bit line terminal 303 and the select terminal 317. In particular, when both of the free and pinned magnetic elements 309, 307 are in the same magnetic orientation (the Parallel state), the resistance between the bit line terminal 303 and the select terminal 317 is a lower resistance as compared to a higher resistance between the bit line terminal 303 and the select terminal 317 when the free and pinned magnetic elements 309, 307 are switched to opposite magnetic orientations (the Antiparallel state). Thus, an S—S magnetic orientation of the magnetic bit element 305 provides the lower resistance whereas a N—S relative magnetic orientation exhibits the higher resistance. In this manner, the state of the magnetic bit element 305 and thus the MRME 301 is determined by measuring the effective resistance between the bit line terminal 303 and the select terminal 317. The state determination of the MRME 301 may be achieved by applying a voltage across (or a current through) the bit line terminal 303 and the select terminal 317 and measuring the resulting current through (or voltage across) the magnetic bit element 305.

In particular MRME configurations, the lower resistance, denoted $R_0$, is approximately 10 kilo-ohms (KΩ) and the higher resistance, denoted $R_1$, is approximately 14 KΩ. It is noted, however, that the MRME 301 is a non-linear device and that its resistance varies with applied voltage. Any references in this disclosure to specific resistance values are exemplary only and provided solely for purposes of illustration. Resistance may vary depending upon the applied voltage in the particular embodiment and configuration. Furthermore, the present invention is not limited to any particular magnetoresistive memory element structure and other resistive values and resistive ratios may be utilized as would be readily appreciated by those of ordinary skill in the art.

FIG. 3B is a symbolic representation of the MRME 301 using a symbol 331, which is somewhat similar to a transistor symbol. The resistive properties of the MRME 301 are represented by a resistor symbol 333 within a circle symbol 341. A select terminal (SEL) representing the select terminal 317 is shown coupled to one side of the resistor symbol 333 and a "T" connection symbol 337 is shown coupled to the other side of the resistor symbol 333. The T symbol 337 represents the bit line terminal 303. Another T symbol 339, similar to a gate symbol of a CMOS transistor, is shown within the circle symbol 341 and adjacent the resistor symbol 333 to denote the digit line terminal 323.

It is noted that the transistor 319 is omitted in the symbol 331 as optional depending upon the circuit configuration of the MRME 301. In memory configurations such as MRAM, the transistor 319 is included and controlled by the WL 321 to read the state of the MRME 301. The memory configuration is utilized in some of the analog functional modules as further described below. In an alternative circuit configuration, the resistive properties of the MRME 301 may be utilized by suppressing the T symbol 337 and showing the resistor symbol 333 coupled in circuit as illustrated by an MRME 501 shown in FIG. 5. In the resistive configuration, the MRME 301 is configured with the digit line terminal 323 as the easy axis terminal and the bit line terminal 303 as the hard axis terminal, so that the digit line terminal 323 is primarily utilized to switch the memory cell. In the resistive configuration, the electrical coupling of the bit line terminal 303 and the select terminal are interchangeable since a hard axis current in either direction may be utilized as long as the threshold current level is achieved.

FIG. 4A is a graph diagram illustrating the switching properties of the MRME 301. An easy axis field is plotted along the "Y" or vertical axis and a hard axis field is plotted along the horizontal or "X" axis. As described previously, the digit line terminal 323 and the bit line terminal 303 may each be utilized as either the easy or hard axis terminal. The easy axis field is the primary field used to switch the MRME 301 into a determined resistive, magnetic, or logic state. A positive direction of the easy axis field, illustrated by an arrow 401, denotes a resistive state "a" and a negative direction, as illustrated by an arrow 403, denotes a different resistive state "b". The a and b states may represent either low or high logic states or a logic zero (0) or a logic one (1) and may be represented as the lower resistance $R_0$ or the higher resistance $R_1$. For example, state a may represent a logic one whereas state b represents a logic zero and vice-versa. The a state may be represented with the $R_1$ resistance and the b state may be represented with the $R_0$ resistance and vice-versa. Any combination is possible and contemplated.

As shown in FIG. 4A, three a state regions 405, 407 and 409 are shown in the positive Y direction and three b state regions 411, 413 and 415 are shown in the negative Y direction along the easy axis field. The triangular region 405 is positioned in the positive X and Y quadrants and the triangular region 407 is positioned in the positive Y, negative X quadrant. In a similar manner, the triangular region 411 is positioned in the negative Y, positive X quadrant and the triangular region 413 is positioned in the negative Y, negative X quadrant. The rectangular regions 409, 415 are substantially symmetric with respect to the Y axis and extend in both positive and negative X directions. Currents applied along the easy axis and/or the hard axis with a corresponding magnitude and having sufficient strength to enter any of the regions 405–415 cause the MRME 301 to switch to the designated state of that region. The triangular regions 405, 407, 411 and 413 each include a hypotenuse threshold line 417, 419, 421 and 423, respectively, representing switching thresholds into the respective regions. In this manner, for the triangular regions 405, 407, 411 and 413, the greater the threshold current level applied along the hard axis, the lesser the current level needed along the easy axis to cause the MRME to switch to the designated state, and vice-versa.

Positive and negative 50% levels are illustrated along the easy axis for both positive and negative Y directions. The 50% levels represent the resultant magnetic fields along the easy axis in response to 50% current levels. The regions 405 and 407 are positioned on either side of, and approximately centered with, the positive 50% level. In a similar manner, the regions 411 and 413 are positioned on either side of, and approximately centered with, the negative 50% level. Positive (+Th) and negative (−Th) threshold levels, corresponding to the positive and negative 50% levels, respectively, are illustrated along the hard axis for both positive and negative X directions. The threshold levels represent the resultant magnetic fields along the hard axis in response to threshold current levels that are just sufficient, in combination with the corresponding 50% current levels along the easy axis, to switch the MRME 301 to the corresponding state. In particular, the positive 50% level and the positive threshold level intersect at a switch point 425 along the hypotenuse line 417 of the region 405, the positive 50% level and the negative threshold level intersect at a switch point 427 along the hypotenuse line 419 of the region 407, the negative 50% level and the positive threshold level intersect at a switch point 429 along the hypotenuse line 421 of the region 411, and the negative 50% level and the negative threshold level intersect at a switch point 430 along the hypotenuse line 423 of the region 413.

In this manner, a current of at least the 50% level along the easy axis and a current of at least the threshold level along the hard axis causes the MRME 301 to switch to the corresponding state. In particular, a positive 50% current level or greater along the easy axis and a positive threshold current level or greater along the hard axis causes the MRME 301 to switch to state a (region 405). Likewise, a positive 50% current level or greater along the easy axis and a negative threshold current level or less along the hard axis causes the MRME 301 to switch to state a (region 407), a negative 50% current level or less along the easy axis and a positive threshold current level or greater along the hard axis causes the MRME 301 to switch to state b (region 411) and a negative 50% current level or less along the easy axis and a negative threshold current level or less along the hard axis causes the MRME 301 to switch to state b (region 413) .Further, as illustrated by the hypotenuse threshold lines 417–423, a greater level of threshold current along the hard axis requires less current along the easy axis and vice-versa. It is noted that in working embodiments, a current level greater than the indicated threshold levels is used in combination with the 50% current levels to ensure that the MRME 301 switches to the appropriate state.

Positive and negative 100% levels are illustrated along the easy axis for both positive and negative Y directions. The 100% levels represent the resultant magnetic fields along the easy axis in response to 100% current levels. The regions 409 and 415 are positioned approximately at the positive and negative 100% levels, respectively, and both regions 409 and 415 extend in both the positive and negative X directions along the hard axis. The origin represents approximately zero field strength along the easy and hard axis.

A positive 100% current level along the easy axis causes the MRME 301 to switch to, or otherwise remain in, state a regardless of the current level along the hard axis. Similarly, a negative 100% current level along the easy axis causes the MRME 301 to switch to, or otherwise remain in, state b regardless of the current level along the hard axis. It is noted that a current level slightly less than and greater than the 100% level may suffice to switch the MRME 301 to the desired state.

It is appreciated that the easy axis field may be utilized alone to switch the MRME 301 as illustrated by regions 409 and 415. In this manner, regardless of the field strength along the hard axis, a strong field in either direction along the easy axis causes the MRME 301 to switch to a determined state. The hard axis field is not used in a similar manner to switch or control the state of the MRME 301. Even with a very strong positive or negative hard axis field, as long as the easy axis field remains approximately zero, the state of the MRME 301 either remains unchanged or is indeterminate. A slight positive easy axis field may cause the MRME 301 to switch to state a whereas a slight negative easy axis field may cause the MRME 301 to switch to state b. However, the hard axis field is not used alone to switch the state of the MRME 301 since the resulting state is indeterminate. Instead, the hard axis field is used in combination with a less than 100% current level along the easy axis to perform switching.

Figure 4B:
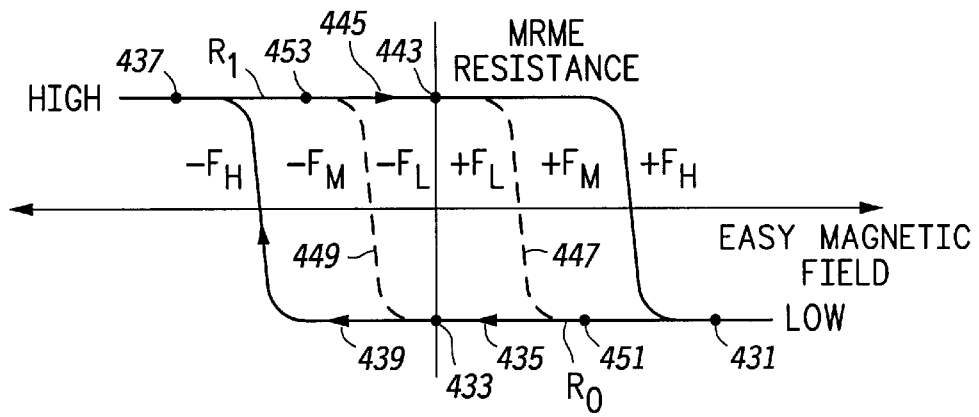
FIG. 4B is a graph diagram illustrating resistance of the MRME of FIG. 3A with respect to corresponding magnetic field strength along the easy axis.

FIG. 4B is a graph diagram illustrating resistance of the MRME 301 with respect to corresponding magnetic field strength along the easy axis. The magnetic field strength is plotted along the X axis and the MRME resistance is plotted along the Y axis. The magnetic field is generally denoted with the letter "F" and the corresponding field strength is denoted with corresponding subscripts "L" for low, "M" for medium and "H" for high. Positive "+" and negative "−" prescripts denote relative field direction. The MRME resistance switches between the relatively low resistance $R_0$ and the relatively high resistance $R_1$.

A strong magnetic field in the positive direction as denoted by $F_H$ causes the MRME 301 to switch to resistance $R_0$ as shown at point 431. Relaxation of the magnetic field back to zero causes the MRME 301 to remain at resistance $R_0$ as shown at point 433 and as indicated by direction arrow 435. A strong magnetic field in the negative direction as denoted $-F_H$ causes the MRME 301 to switch to the resistance $R_1$ as shown at point 437 and as indicated by direction arrow 439. Relaxation of the magnetic field back to zero causes the MRME 301 to remain at resistance $R_1$ as shown at point 443 and as indicated by direction arrow 445.

A weak magnetic field applied in either the positive or negative directions as denoted by $F_L$ or $-F_L$ will not allow the MRME 301 to switch states regardless of the strength of the hard axis magnetic field. A threshold field applied along the hard axis, in either positive or negative directions, causes the switching characteristics of the MRME 301 to change as indicated by dashed lines 447 and 449. While the threshold hard axis field is applied, a medium magnetic field in the positive direction as denoted by $F_M$ causes the MRME 301 to follow dashed line 447 and switch to resistance $R_0$ as shown at point 451. Relaxation of the magnetic field back to zero causes the MRME 301 to remain at resistance $R_0$ as shown at point 433 and as indicated by direction arrow 435. A medium magnetic field in the negative direction as denoted $-F_M$ causes the MRME 301 to follow the dashed line 449 and switch to the resistance $R_1$ as shown at point 453. Relaxation of the magnetic field back to zero causes the MRME 301 to remain at resistance $R_1$ as shown at point 443 and as indicated by direction arrow 445.

Figure 5:
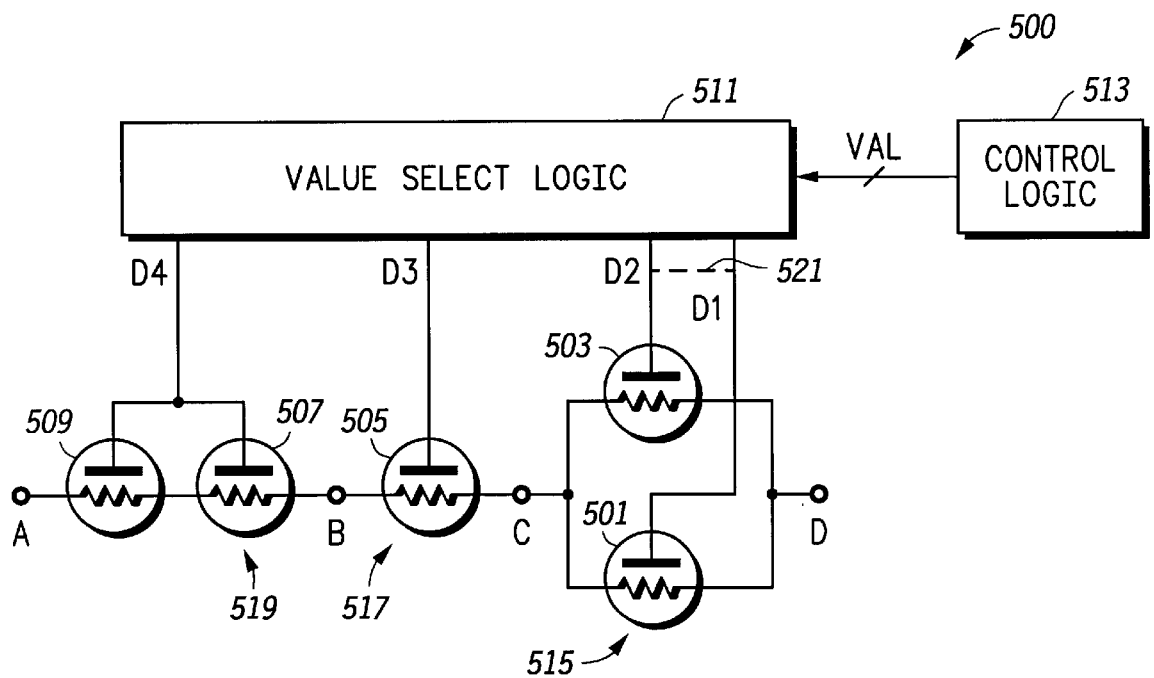
FIG. 5 is a schematic diagram of a programmable resistive circuit implemented using magnetoresistive memory technology.

FIG. 5 is a schematic diagram of a programmable resistive circuit 500 implemented using multi-state magnetoresistive memory elements. Five a MRME devices 501, 503, 505, 507 and 509 (501–509) are coupled in an array between nodes labeled A and D. Each of the MRME devices 501–509 is coupled in the resistive configuration to utilize its resistive properties. In particular, the resistive value between the bit line and select terminals is utilized to access the resistive property to create a programmable resistive value. Each digit line terminal serves as a control input used to switch the state of a respective one of the MRMEs 501–509 between their respective low $R_0$ and high $R_1$ resistances to create an overall programmable resistance. Thus, the digit line terminals are configured as the easy axis terminal whereas the bit line terminals are configured as the hard axis terminals for the programmable resistive circuit 500. In the resistive configuration, the coupling of the select and bit line terminals may be reversed so that they will be treated herein as "interchangeable", although it is understood that the threshold current may still be utilized at the bit line terminal to perform switching of the MRME. In this manner, the respective ends of the resistance of each MRME are referred to as resistive ends rather than bit line or select terminals.

Node A is coupled to one resistive end of the MRME 509, which has its other resistive end coupled to one resistive end of the MRME 507. The other resistive end of the MRME 507, referred to as node B, is coupled to a resistive end of the MRME 505, which has its other resistive end coupled to node C. Node C is coupled to a resistive of each of the MRME devices 501, 503, which have their other resistive ends both coupled to a node D. The digit line terminals of the MRMEs 501–509 are coupled to receive signals D1, D2, D3 and D4, respectively, from value select logic 511, which is further coupled to and controlled by control logic 513.

The value select logic 511 asserts the D1–D4 signals to control the state of the MRMEs 501–509. In particular, the D1 signal controls the state of MRME 501, the D2 signal controls the state of the LIE 503, the D3 signal controls the state of MRME 505 and the D4 signal controls the state of the MRMEs 507, 509. In one embodiment, the value select logic 511 controls the MRME devices 501, 503 independently via the D1 and D2 signals. Alternatively, the D1 and D2 signals may be replaced with one signal D1, or as indicated by a dashed line 521, may be asserted together to control both of the MRME devices 501, 503 simultaneously.

In operation, the control logic 513 asserts a value control signal (VAL) to the value select logic 511, which responsively controls the D1–D4 signals to program a resistance value between nodes A and D. The VAL signal may be an analog or a digital signal. The value select logic 511 includes the appropriate logic and circuitry to interpret the VAL signal and to correspondingly assert the appropriate currents through the D1–D4 signals to program the MRMEs 501509. In one embodiment, the VAL signal is a three-bit digital value, where the value select logic 511 may further include a memory device, such as register or the like, to store the VAL signal. The D1 and D2 signals are controlled as a single signal D1. In an alternative embodiment, the VAL signal is a four-bit value to control the D1–D4 signals including the D2 signal.

It is appreciated that the MRMEs 501–509 are coupled in a successive configuration, and more particularly, in a binary successive configuration to enable programming of progressive resistive values. In particular, the MRMEs 501, 503 are coupled in parallel forming a first stage or segment 515 of the programmable resistive circuit 500 between nodes C and D. A single MRME 505 is coupled between nodes B and C forming a second stage or segment 517 of the programmable resistive circuit 500. The MRMEs 507 and 509 are coupled in series between nodes A and B forming a third stage or segment 519 of the programmable resistive circuit 500. In this manner, a linear progression of resistive values between nodes A and D may be programmed by the value select logic 511 using binary progressive values. Each of the MRMEs 501–509 is programmed into two resistive states having resistances $R_0$ or $R_1$. In the first segment 515, the MRMEs 501, 503 are programmed together to have resistance $R_0//R_0=R_0/2$, or $R_1//R_1=R_1/2$, where "//" denotes that the resistors are electrically coupled in parallel. Of course, a resistance $R_0//R_1$ may also be achieved by controlling the D1 and D2 signals separately. The segment 517 is programmed to have resistance $R_0$ or $R_1$. The segment 519 is programmed to have resistance $2R_0$ or $2R_1$.

The overall resistance between nodes A and D, or $R_{AD}$, of the programmable resistive circuit 500 is programmable between resistance values $3.5R_0$ to $3.5R_1$ in increments of $(R_1-R_0)/2$ when the MRMEs 501, 503 of segment 515 are controlled together. Each of the three VAL bits is used by the value select logic 511 to program or otherwise control a corresponding segment 515–519, where the least significant bit (LSB) controls the segment 515 to switch between $R_0/2$ and $R_1/2$, the next bit controls the segment 517 to switch between $R_0$ and $R_1$, and the most significant bit (MSB) controls the segment 519 to switch between $2R_0$ and $2R_1$. For example, for $R_0=10$ KΩ and for $R_1=14$ KΩ (approximate values), the programmable resistive circuit 500 is programmable between resistance values 35 KΩ and 49 KΩ in 2 KΩ increments. VAL, as a three-bit value, may be used to program the resistance of the programmable resistive circuit 500 to have resistance values 35 KΩ, 37 KΩ, 39 KΩ, . . . , 49 KΩ for VAL=000b, 001b, 010b, . . . , 111b, respectively (where postscript "b" denotes a binary value).

In an alternative embodiment, the value select logic 511 may control the D1 and D2 signals separately to achieve three different resistances $R_0/2$, $R_1/2$ and $R_1//R_0$ (or $R_0//R_1$) of the segment 515. It is noted, however, that since two signals or bits are used to select between three states, that a binary linear progression is not necessarily achieved. Since the resistances of any two MRMEs may not be equal, four states are achieved ($R_0//R_1$ vs. $R_1//R_0$) although for many practical configurations, two of the states are substantially equivalent effectively resulting in three states. Also, the third resistance value with respect to the other two resistance values of the segment 515 depends on the resistance values $R_1$ and $R_0$, and more particularly on their ratio $R_1/R_0$. For example, for $R_0=10$ KΩ and for $R_1=14K$ Ω, the three resistance values are 5 KΩ, 5.83 KΩ and 7 KΩ, where 5.83 KΩ is close to 6 KΩ. Thus, for VAL=00[00]b, 00[01,10]b, 00[11]b, 01[00], 01[01,10], . . . , 11[11]b, $R_{AD}$=35 KΩ,~36 KΩ, 37 KΩ, 39 KΩ, ~40 KΩ, . . . , 49 KΩ, respectively. The additional programmable levels, even if resulting in a nonlinear succession, may be desirable in certain circuit configurations.

In any of the embodiments or configurations, a source may be provided to assert a source signal across, or through, nodes A and D, to achieve a desired output result that is a combination of signals developed by each of the MRMEs 501–509. In particular, a voltage source may apply a voltage across nodes A and D resulting in a current through the programmable resistive circuit 500. Or, a current source may apply a current through nodes A and D resulting in a voltage across nodes A and D. The magnitude of the source signal defines the scale. Additional stages or segments may be added to increase the resolution and range of resistive values. For example, additional parallel segments $R_x/3$, $R_x/4$, $R_x/5$, $R_x/8$, etc. (where "X" denotes the programmed state of each MRME, such as 0 or 1) alone or in combination may be added to achieve a greater resistive resolution by increasing the number of programmable states or decreasing the resistance change between respective states. Also, additional series segments may be added, such as $3R_x$, $4R_x$, $5R_x$, $8R_x$, $16R_x$, etc. to increase the overall range of resistive values. It is further contemplated that a combination of series-coupled and parallel-coupled memory elements may be utilized in any one or more additional or alternative segments. As appreciated to one of ordinary skill in the art, the value select logic 511 is implemented to control individual or collective MRMEs to achieve desired resistive values for particular input values.

Figure 6:
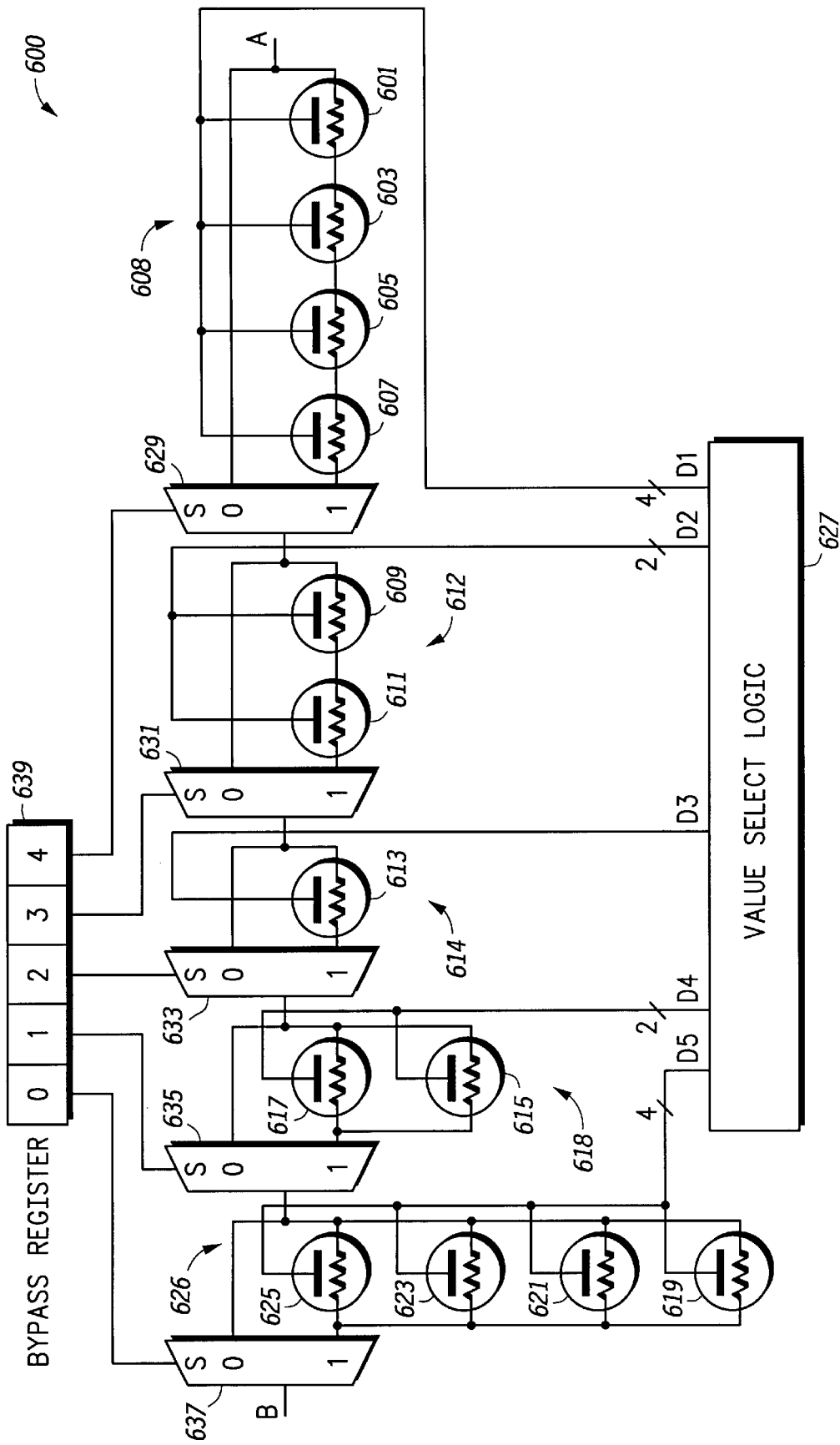
FIG. 6 is a schematic diagram of another programmable resistive circuit implemented according to an alternative embodiment using magnetoresistive memory technology.

FIG. 6 is a schematic diagram of another programmable resistive circuit 600 implemented according to an alternative embodiment. The programmable resistive circuit 600 includes five programmable stages or segments 608, 612, 614, 618 and 626. The first segment 608 includes four MRMEs 601, 603, 605, and 607 having their resistive terminals coupled in series between a first terminal or node A and to a logic 1 input of a two-input multiplexor (MUX) 629. The second segment 612 includes two MRMEs 609 and 611 having their resistive terminals coupled in series between the output of the MUX 629 and the logic 1 input of another two-input MUX 631. The third segment 614 includes a single MRME 613 which has its resistive terminals coupled between the output of the MUTX 631 and the logic 1 input of another two-input MUX 633. The next segment 618 includes two MRMEs 615, 617 having their resistive terminals coupled in parallel between the output of the MUX 633 and the logic 1 input of another two-input MUX 635. A fifth segment 626 includes four MRMEs 619, 621, 623 and 625 having their resistive terminals coupled in parallel between the output of the MUX 635 and the logic 1 input of another two-input MUX 637. The output of the MUX 637 is coupled to an output terminal or node B of the programmable resistive circuit 600.

Value select logic 627 is included to control the state of each of the MRME devices 601–625 either individually or collectively as coupled in the segments 608, 612, 614, 618 or 626. In particular, the value select logic 627 asserts a signal D1 to the control input or digit line terminals of the MRMEs 601–607 of the segment 608, a signal D2 to the control input or digit line terminals of the MRMEs 609, 611 of the segment 612, a signal D3 to the control input or digit line terminal of the MRME 613 of segment 614, a signal D4 to the control input or digit line terminals of the MRMEs 615, 617 of segment 618 and a signal D5 to the control input or digit line terminals of the MRMEs 619–625 of the segment 626. The D1–D5 signals may each comprise one signal coupled to the collective digit line terminals or may each comprise multiple signals to individually control the MRMEs. For example, the D1 signal may be one signal coupled to all of the digit line terminals of the MRMEs 601–607 or may alternatively be four separate signals to individually control the MRMEs 601–607.

The A node is coupled to the logic 0 input of the first MUX 629, the output of the MUX 629 is provided to the logic 0 input of the next MUX 631, the output of the MUX 631 is provided to the logic 0 input of the next MUX 633, the output of the MUX 633 is provided to the logic 0 input of the next MUX 635, and the output of the MUX 635 is provided to the logic 0 input of the final MUX 637. Bypass logic including a bypass memory device and multiplex logic is provided to bypass any one or more of the segments 608–626 as desired. In particular, a five-bit bypass register 639 is provided to control the MUXs 629–637. Bit 0 of the bypass register 639 is provided to the select (S) input of the MUX 637, bit 1 is provided to the select input of the MUX 635, bit 2 is provided to the select input of the MUX 633, bit 3 is provided to the select input of the MUX 631, and bit 4 is provided to the select input of the MUX 629.

In operation, the bypass register 639 is used to bypass any of the programmable segments 608, 612, 614, 618 and 626. The value select logic 627 is used to select the resistive state of each of the segments. For example, all zeros in the bypass register 639 effectively couples the A and B nodes together effectively bypassing all of the segments 608, 612, 614, 618 and 626. All logic ones programmed into the bypass register 639 places all of the segments between the A and B nodes in circuit. A source applied across or through the nodes A and B causes an output signal to be developed that is a combination of signals developed by each of the memory elements of each of the segments that has not been bypassed. For example, a source voltage applied across nodes A and B develops a corresponding output current and a source current applied through nodes A and B develops a corresponding output voltage across nodes A and B based on the programmed state of the segments. It is noted that a value 01110b programmed into the bypass register 639 bypasses segments 608 and 626 leaving segments 612, 614 and 618 resulting in a similar configuration as the programmable resistive circuit 500.

In a simple configuration, the bypass register 639 is programmed with all logic ones to select all of the segments. Each of the MRMEs 601–625 is programmed in a similar manner as previously described to have a low resistance $R_0$ or a high resistance $R_1$. As before, $R_0$ may represent a logic zero and $R_1$ may represent a logic one or vice-versa. Further, the D1–D5 signals asserted by the value select logic 627 may be single-bit values forming a five-bit programmed selection. In this manner, a variable resistance between the A and B nodes is achieved from 7.75 $R_0$ to 7.75 $R_1$ in increments of $(R_1-R_0)/4$. For $R_0$=10 KΩ and $R_1$=14 KΩ (approximate values), the programmable resistance range is 77.5 KΩ to 108.5 KΩ in 1 KΩ increments.

In an alternative embodiment, all of the MRMEs 601–625 are programmed to $R_0$ by the value select logic 627, where the bypass register 639 is used to vary the resistance between the A and B nodes. In this case, a programmable resistance from 1/4 $R_0$ to 7.75 $R_0$ with increments of $R_0/4$ is achieved. For $R_0$=10 KΩ, this provides programmable resistances of 2.5 KΩ to 77.5 KΩ with increments of 2.5 KΩ. In yet another alternative embodiment, the value select logic 627 may program all of the MRMEs 601–625 to the $R_1$ resistance for a variable resistance from $R_1/4$ to 7.75 $R_1$ in increments of $R_1/4$. In this latter configuration, for $R_1$=14 KΩ, a resistance of 3.5 KΩ to 108.5 KΩ in increments of 3.5 KΩ is achieved.

In a more general embodiment, the bypass register 639 and the value select logic 627 are used in combination to achieve a plurality of different programmable values between $R_0/4$ to 7.75$R_1$ (2.5 KΩ to 108.5 KΩ for 10 KΩ and 14 KΩ resistive values, respectively). Linearity for all possible combinations depends upon the ratio of $R_1/R_0$. In particular, the progression of values may or may not be linear depending upon the use of the D1–D5 signals and the resistance ratio of $R_0$ and $R_1$.

Additional variations can be achieved by controlling individual MRMEs within the segments 618, 626 in a similar manner as previously described. Also, additional parallel segments may be added to achieve greater resolution, such as $R_x/3$, $R_x/5$, $R_x/6$, $R_x/8$, $R_x/16$, etc. Additional series segments may be added to increase range, such as $3R_x$, $5R_x$, $6R_x$, $8R_x$, $16R_x$, etc. It is further contemplated that a combination of series-coupled and parallel-coupled memory devices may be utilized in the programmable resistive circuit 600 in any one or more additional or alternative segments. In this manner, it is contemplated that almost any range of variable resistances with appropriate incremental values can be achieved using the magnetoresistive memory technology described herein. As appreciated to one of ordinary skill in the art, control logic is implemented to control individual or collective MRMEs to achieve desired resistive values for particular input values.

Figure 7:
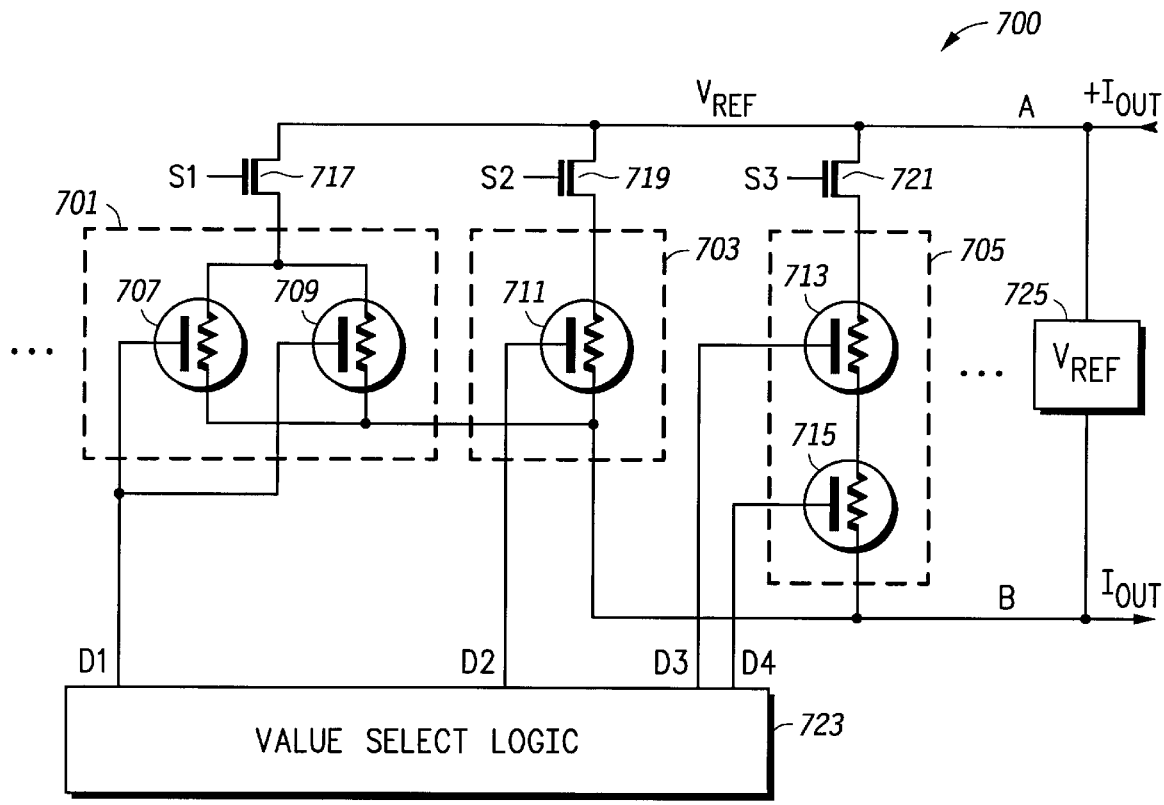
FIG. 7 is a schematic diagram of a programmable current source using magnetoresistive memory technology.

FIG. 7 is a schematic diagram of a programmable current source 700 using magnetoresistive memory technology. The programmable current source 700 includes a plurality of programmable segments, including a first segment 701, a second segment 703 and a third segment 705, coupled together to form a resistive circuit between a first terminal or node A and a second terminal or node B. The first segment 701 includes two MRMEs 707, 709 having their resistive terminals coupled in parallel. The segment 703 includes a single MRME 711. The segment 705 includes two MRMEs 713, 715 coupled in series, where one resistive terminal of the MRME 715 is coupled to node B and the other resistive terminal is coupled to one resistive terminal of the MRME 713. One resistive terminal of each of the MRMEs 707–711 is coupled to node B.

The other terminals of the MRMEs 707,709 are coupled to one current terminal of a transistor 717. The other resistive terminal of the MRME 711 is coupled to a current terminal of another transistor 719. The other resistive terminal of the MRME 713 is coupled to one current terminal of another transistor 721. The other current terminals of the transistors 717–721 are coupled to node A. The control terminal of the transistors 717, 719 and 721 are controlled by select signals S1, S2 and S3, respectively, for individually selecting the segments 701, 703, and 705, respectively. In particular, assertion of the S1 signal activates transistor 717 to include the segment 701. Likewise, the S2 signal is asserted to select the segment 703 and the S3 signal is asserted to select the segment 705.

The select transistors 717–721 are optional and are utilized in a similar manner as the bypass logic of the programmable resistive circuit 600 to selectively bypass or otherwise remove any of the corresponding segments 701–705. A bypass memory element along with other supporting drive circuitry (not shown) may be included to control the transistors 717–721. The transistors 717–721 may be MOS-type transistors having drain and source terminals acting as the current terminals and gate terminals acting as control terminals. Alternatively, the transistors 717–721 may be bipolar-type transistors having collector and emitter terminals acting as the current terminals and base terminals acting as control terminals. Of course, suitable alternative select devices or selection circuitry may be utilized. In fact, the bypass logic of the programmable resistive circuit 600 including a bypass register and multiplex logic may be used instead. The transistors and corresponding bypass memory and circuitry may be used to replace the bypass logic shown for the programmable resistive circuit 600.

Value select logic 723 controls the state of each MRME within each of the segments 701–705. In particular, value select logic 723 asserts a signal D1 to the control input or digit line terminals of the MRMEs 707, 709. The value select logic 723 asserts a signal D2 to the control input or digit line terminal of the MRME 711. The value select logic 723 asserts control signals D3 and D4 to the control input or digit line terminals of the MRMEs 713, 715 respectively. As before, the value select logic 723 may assert the D3 and D4 signals independently or collectively to program up to three different resistive states of the segment 705. Of course, since the resistances of the MRMEs 713, 715 may not be equal, four states are achieved although for many practical configurations, two of the states are substantially equivalent. A voltage reference source 725 is coupled to assert a reference voltage VUF between the A and B nodes and an output current $I_{OUT}$ is measured as the current through nodes A, B. The output current $I_{OUT}$ is programmable and comprises a combination of current signals developed by each of the memory elements of each segment that is not removed or bypassed.

The value select logic 723 is utilized to program the state of each of the stages 701–705 in a similar manner as previously described. In particular, the value select logic 723 asserts the D1–D4 signals to select the state of each of the MRMEs 707–715 to either $R_0$ or $R_1$ as previously described. If all of the MRMEs 707–715 are programmed to resistance $R_0$, then the select signals S1–S3 may be used to program a linear progression of currents for $I_{OUT}$. If $V_{REF}/R_0=I_0$, then the programmable current source 700 may be utilized to program current values of $\frac{1}{2}I_0/2$ to $3.5I_0$ in increments of $I_0/2$. For example, for S1, S2, S3 equal to 001b, a current $I_{OUT}=I_0/2$ flows through segment 705. Effectively no current flows through the segments 701 and 703 since they are bypassed. Also, for S1, S2, S3 =010, then $I_{OUT}=I_0$ flows through the segment 703. Similarly, for S1, S2, S3=100, then $I_{OUT}=2I_0$ flows through segment 701. A similar configuration is achieved if the value select logic 723 programs the MRME 707–715 to $R_1$. If $V_{REF}/R_1=I_1$, then a programmable current from $I_1/2$ to $3.5I_1$ with increments of $I_1/2$ is achieved.

In an alternative operable configuration, the select signals S1, S2 and S3 may be activated to select all of the segments 701–705 and the value select logic 723 may be used to program the output current $I_{OUT}$. Although the D3 and D4 signals may be asserted independently, in a first configuration they are asserted as the same signal, say D3, to program the state of both of the MRMEs 713, 715 to the same state. Assume that D1, D2, D3 operate collectively as logic 000b to achieve the highest current $I_0$ for the lower resistance $R_0$ and D1, D2, D3 operate as logic 111b to achieve the lowest current $I_1$ for the higher resistances $R_1$. Thus, a current range of $3.5I_1$ to $3.5I_0$ in increments of $(I_0-I_1)/2$ is achieved. The value select logic 723 and the S1–S3 signals may be utilized in combination to achieve a greater number of current values, although linearity may depend upon use of the D3 and D4 signals and the resistive ratio of $R_0$ to $R_1$.

In general, the programmable segments form a successive configuration to enable programming of linear or a non-linear progressive current values. A binary successive configuration is particularly useful for digital systems. The magnitude of the $V_{REF}$ signal may be changed to modify the output current scale. Additional segments may be added for increased range and resolution. For example, additional parallel segments $3I_x$, $4I_x$, $5I_x$, $8I_x$, $16I_x$, etc. (where "X" denotes different current states such as 0 or 1) may be added to increase range. Additional series segments $I_x/3$, $I_x/4$, $I_x/5$, $I_x/8$, $I_x/16$, etc. may be added for additional current resolution. Also, any additional or alternative segments including a combination of series-coupled and parallel-coupled memory elements may be utilized.

Figure 8:
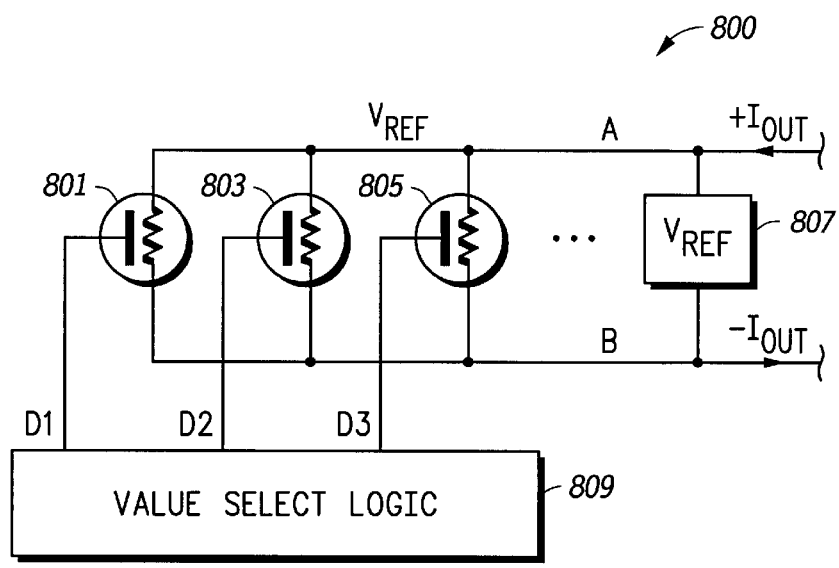
FIG. 8 is a schematic diagram of another programmable current source implemented according to an alternative embodiment using magnetoresistive memory technology.

FIG. 8 is a schematic diagram of another programmable current source 800 implemented according to an alternative embodiment. A plurality of MRMEs 801, 803, 805, etc. are coupled in parallel between nodes A and B. In particular, the resistive terminals of each of the MRMEs 801–805 are coupled together between the nodes A and B. A reference voltage source 807 asserting a voltage reference signal $V_{REF}$ is applied across nodes A and B. Value select logic 809 is provided to individually select the states of each of the MRMEs 801–805. In particular, the value select logic 809 asserts a signal D1 to the digit line terminal of the MRME 801, a signal D2 to the digit line terminal of the MRME 803 and a signal D3 to the digit line terminal of the MRME 805. An output current $I_{OUT}$ is achieved through the nodes A and B. Assuming $I_0=V_{REF}/R_0$ and $I_1=V_{REF}/R_1$, where $I_0$ is greater than $I_1$, and if there are "n" cells in parallel, then the programmable current source 800 provides a range of $nI_1$ to $nI_0$ with increments of $I_0-I_1$. It is noted of course, that the resistive states of each MRME is approximately the same as the other MRMEs so that n MRMEs coupled in parallel results in only n+1 different states.

Figure 9:
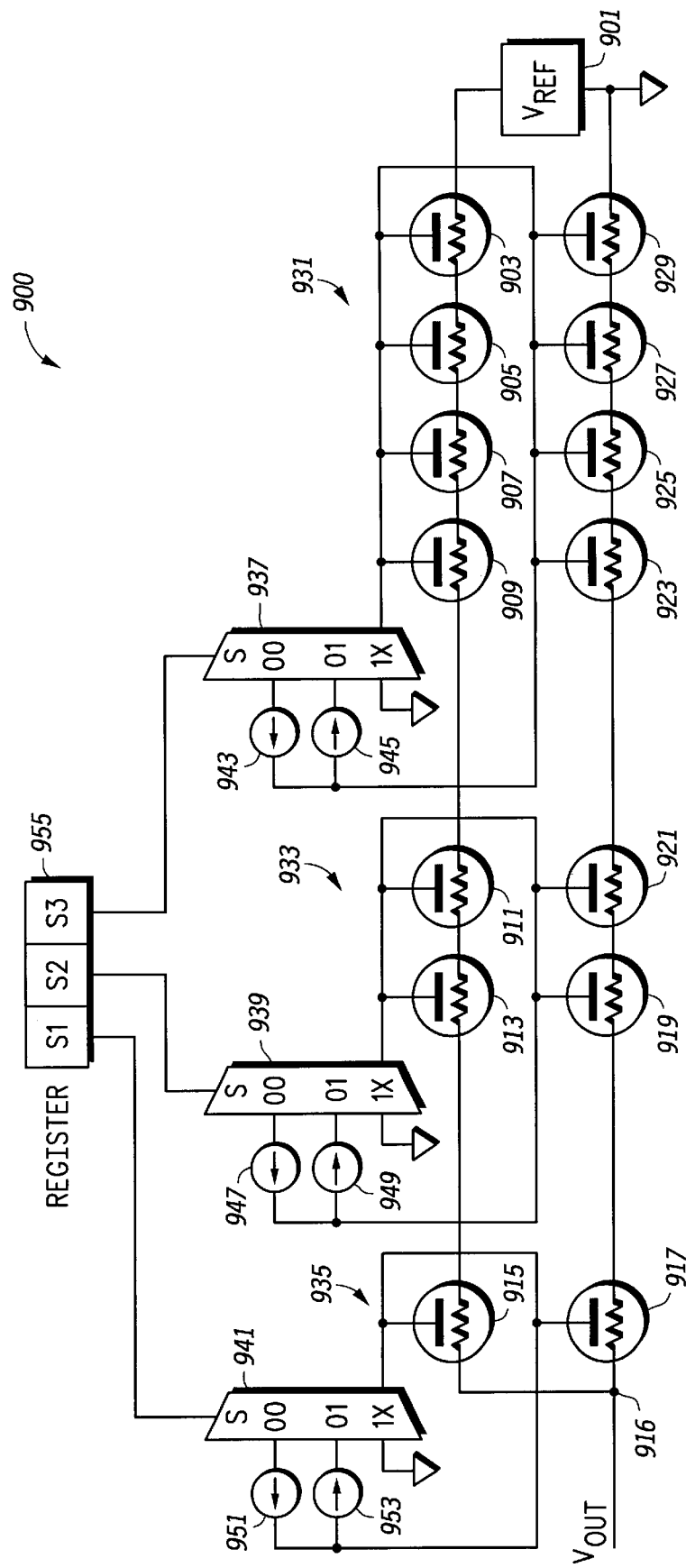
FIG. 9 is a schematic diagram of a programmable voltage divider circuit using magnetoresistive memory technology.

FIG. 9 is a schematic diagram of a programmable voltage divider circuit 900 using magnetoresistive memory technology. A reference voltage source 901 asserts a reference voltage signal $V_{REF}$. A plurality of MRMEs 903, 905, 907, 909, 911, 913, 915 (903–915) have their resistance terminals coupled in series forming a first resistive circuit between the $V_{REF}$ signal and a voltage divider junction 916, where the voltage junction 916 asserts a voltage output signal $V_{OUT}$. Another plurality of MRMEs 917, 919, 921, 923, 925, 927, 929 (917–929) are coupled in series forming a second resistive circuit between the $V_{OUT}$ signal and ground. In this manner, the $V_{OUT}$ signal is programmable and determined by the programmed resistance values of the MRMEs 903–929 and the $V_{REF}$ signal. The MRMEs 903–929 are divided into several programmable stages including a first stage 931 including the MRMEs 903–909 and 923–929, a second stage 933 including the MRMEs 911, 913, 919, and 921 and a third stage 935 including the MRMEs 915 and 917. The MRMEs 903–929 are each configured with its digit line terminal as the easy axis terminal. Each of the stages 931–935 includes two programmable segments including a first programmable segment in the first resistive circuit between the $V_{REF}$ and $V_{OUT}$ signals and a second programmable segment in the second resistive circuit between the $V_{OUT}$ signal and ground.

The stage 931 includes a four-input (00, 01, 10, 11), bi-directional MUX 937 having its output coupled to the control input of the first stage 931 comprising digit line terminals of each of the MRMEs 903–909 and 923–929. A 00 input of the MUX 937 is coupled to the input of a current source 943, having its output coupled to the digit line terminals of each of the MRMEs of the stage 931. A current source 945 has its input coupled to the output of current source 943 and its output coupled to the 01 input of the MUX 937. The stage 933 includes another four-input bi-directional MUX 939 having its 00 input coupled to the input of a current source 947 and its 01 input coupled to the output of a current source 949. The output of the current source 947 and input of the current source 949 are each coupled to the output of the MUX 939 and also to the control input of the stage 933 including the digit line terminals of the MRMEs 911, 913, 919 and 921. The stage 935 includes another four-input bi-directional MUX 941 having its 00 input coupled to the input of a current source 951 and its 01 input coupled to the output of a current source 953. The output of the current source 951 is coupled to the input the current source 953, to the output of the MUX 941 and to the control input of the stage 935 including the digit line terminals of the MRMEs 915, 917. The 10 and 11 inputs (denoted 1X) of the MUXs 941, 939 and 937 are each coupled to ground.

A register 955 includes three fields S1, S2 and S3. In the embodiments shown, each of the fields S1–S3 are two-bit fields coupled to the respective control or select (S) inputs of the MUXs 937–941. In particular, the field S1 of the register 955 is coupled to the select input of the MUX 941, the field S2 is coupled to the select input of the MUX 939 and the field S3 is coupled to the select input of the MUX 937.

The S1–S3 fields of the register 955 are not utilized for bypass but instead are utilized to enable programming of the MRMEs of each of the stages 931–935 of the programmable voltage divider circuit 900. The current sources 943, 947 and 951 are first programmable devices provided for programming each segment of each stage into a corresponding one of two resistive states, and the current sources 945, 949 and 953 are second programmable devices provided for programming each segment of each stage into the other or "opposite" state of the two resistive states. The register 955 and the MUXs 937–941 comprise select logic to select between the first and second programmable devices and ground for each stage.

A value of 10 or 11 (denoted 1x) programmed into any of the S1–S3 fields of the register 955 couples the digit line terminals of each of the MRMEs of each corresponding segment to ground so that the MRMEs of each corresponding segment maintain their respective resistive states. A binary value 00 programmed into any of the S1–S3 fields of the register 955 couples the digit line terminals of each of the MRMEs of corresponding segments to a current source that asserts current in one direction, whereas a value 01 couples a current source that asserts current in the opposite direction. In this manner, a value 00 in any S1–S3 field of the register 955 programs the MRMEs into one resistive state whereas a value 01 programs the MRMEs into the opposite resistive state.

The digit line terminals of the MRMEs 903–915 are coupled in an opposite current direction as the digit line terminals of the MRMEs 917–929 for purposes of programming. In particular, the digit line terminals of the MRMEs 903–909 are coupled in an opposite current direction with respect to the current sources 943, 945 as the digit line terminals of the MRMEs 923–929. In a similar manner, the digit line terminals of the MRMEs 911–913 are coupled in an opposite current direction with respect to the current sources 947, 949 as the digit line terminals of the MRMEs 919–921. Also, the digit line terminal of the MRME 915 is coupled in an opposite current direction with respect to the current sources 951, 953 as the digit line terminal of the MRME 917. In this manner, when the MRMEs 903–909 are programmed into one resistive state by either of the current sources 943–945, then the MRMEs 923–929 are programmed into the opposite resistive state and vice-versa. Likewise, when the MRMEs 913–911 are programmed into one resistive state by either of the current sources 947–949, then the MRMEs 919–921 are programmed into the opposite resistive state and vice-versa, and when the MRME 915 is programmed into one resistive state by either of the current sources 951, 953, then the MRME 917 is programmed into the opposite resistive state and vice-versa.

As an example, a value 00b programmed into the S3 field of the register 955 causes the current source 943 to program the MRMEs 903–909 into a logic state 0 with a resistance of $R_0$, and to program the MRMEs 923–929 into a logic state 1 with a resistance of $R_1$. A value of 01b programmed into the S3 field of the register 955 causes the current source 945 to program the MRMEs 903–909 into a logic state 1 with a resistance of $R_1$, and to program the MRMEs 923–929 into a logic state 0 with a resistance of $R_0$. In a similar manner, 00b programmed into the S2 field programs the MRMEs 911, 913 into logic state 0 with a resistance of $R_0$ and the MRMEs 921, 919 into logic state 1 with a resistance of $R_1$. And 01b programmed into the S2 field programs the MRMEs 911, 913 into logic state 1 with a resistance of $R_1$ and the MRMEs 921, 919 into logic state 0 with a resistance of $R_0$. Also, 00b programmed into the S1 field programs the MRME 915 into logic state 0 with a resistance of $R_0$ and the MRME 917 into logic state 1 with a resistance of $R_1$, and 01b programmed into the S1 field programs the MRME 915 into logic state 1 with a resistance of $R_1$ and the MRME 917 into logic state 0 with a resistance of $R_0$.

Each of the stages 931–935 include an equal number of MRMEs on either side of the voltage junction 916 between the $V_{REF}$ signal and ground. Further, an equal number of MRMEs on either side of the voltage junction 916 are programmed to the opposite resistive state. In this manner, the total resistance between the $V_{REF}$ signal and ground through the MRMEs 903–929 remains the same for each programmed state of any of the stages 931–935.

The output of the programmable voltage divider circuit 900 $V_{OUT}=(nR_0+mR_1)/(mR_0+nR_1)V_{REF}$, where "n" and "m" are integers such that n+m=7, $7 \geq n \geq 0$ and $7 \geq m \geq 0$. The programmable voltage divider circuit 900 therefore has eight states ranging from $V_{OUT}=(7R_0/7(R_1+R_0))V_{REF}$ to $(7R_1/7(R_1+R_0))V_{REF}$, where one, two or four $R_0$ and $R_1$ resistances are swapped to opposites sides of the voltage junction 916 for each S1–S3 programming step. It is appreciated that the programmable voltage divider circuit 900 is in simplified form and that additional stages or segments may be added to achieve greater range and resolution. Also additional or alternative stages or segments may be included with any combination of series-coupled and parallel-coupled memory devices. Further, any number of MRMEs may be provided on either side of the voltage junction 916 including an uneven configuration. Further, it is appreciated that the MRMEs may be arranged in any desired fashion to achieve any balanced or unbalanced configuration. The total resistance between the $V_{REF}$ signal and ground need not be constant and may range from $ZR_0$ to $ZR_1$ if Z represents the total number of MRMEs in the array. A constant total resistance for each state between $V_{REF}$ and ground provides a particular advantage for certain circuits and configurations.

Figures 10, 11:
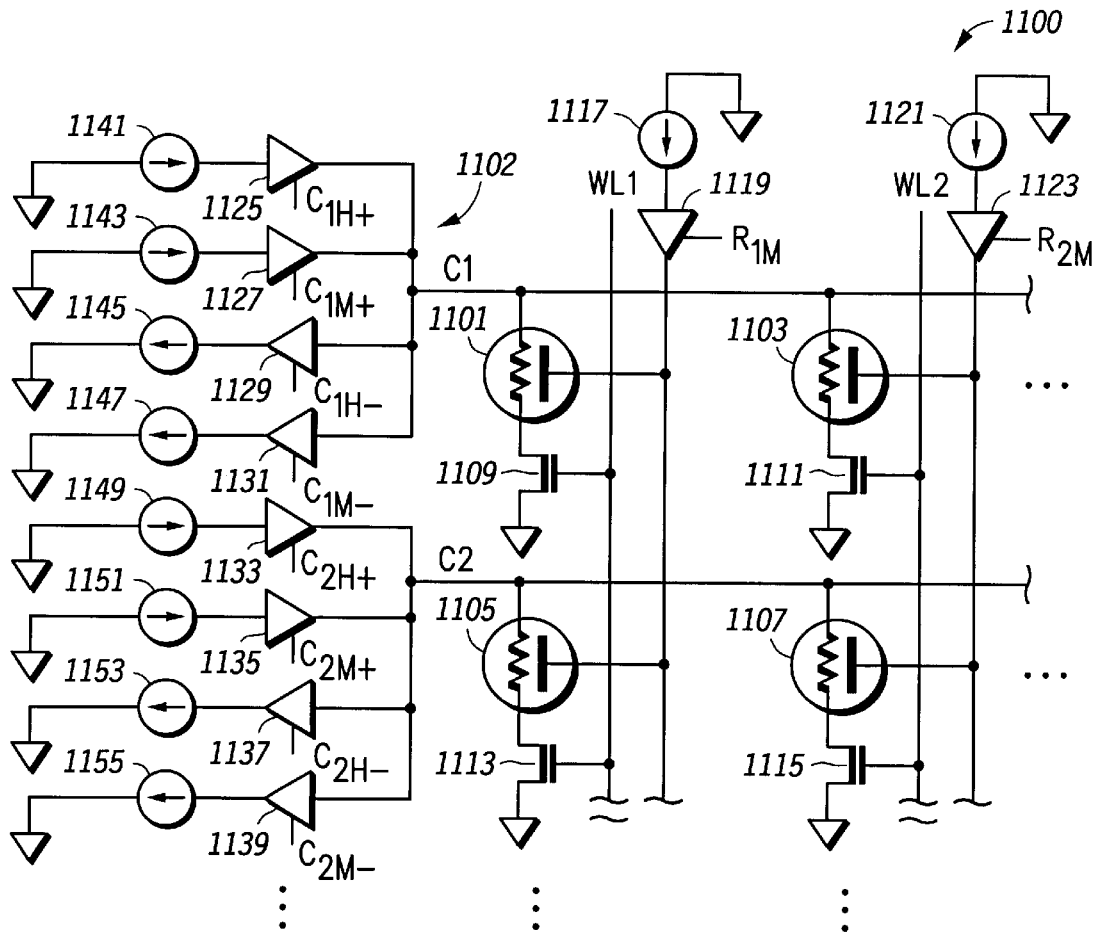
FIG. 10 is a chart diagram illustrating a method of programming a magnetoresistive memory array in a single write operation.
FIG. 11 is a schematic diagram of a portion of a memory array that includes column drive circuitry that is capable of programming all of the memory elements in one or more column memory lines in one write operation.

FIG. 10 is a chart diagram illustrating a method of programming a magnetoresistive memory array. For purposes of illustration, an 8×8 memory array is shown including 8 column memory lines and 8 row memory lines. The magnetoresistive memory array includes 64 multi-state magnetoresistive memory elements coupled within predetermined distances of respective column and row memory lines, where each memory element includes an easy axis terminal along a respective column memory line of the memory array and a hard axis terminal along a respective row memory line of the memory array. In the chart of FIG. 10, column addresses (CCC) for each column memory line are shown along a vertical side ranging from 000b to 111b and row addresses (RRR) for each row memory line are along the top horizontal side ranging from 000b to 111b. Each bit is addressed as CCCRRRb in which the column address is provided first followed by the row address. Also, asserted current levels for the column memory lines are shown on the right vertical side and asserted row currents are shown along the bottom side, as further described below.

It is assumed that each memory element of the memory array is initialized to a logic zero before programming. It is desired to program logic ones for all memory elements along the column memory lines 000b–010b and to program a partial column memory line 0111b with logic ones at row memory lines 000b, 001b and 010b. It is further desired to program the entire memory array in a single write operation.

The memory array is configured to apply a low current level ($I_{RL}$) or a medium current level ($I_{RM}$) along each of the row memory lines and a low current level ($I_{CL}$), a medium current level ($I_{CM}$) or a high current level ($I_{CH}$) along each of the column memory lines. A low current level generally denotes a very low or no current. Referring back to FIG. 4B, for the column memory lines along the easy axis, a low current level denotes a low magnetic field strength $F_L$, a medium current denotes a medium magnetic field strength $F_M$, and a high current denotes a high magnetic field strength $F_H$. In this manner, a medium current level denotes an approximate 50% current level whereas a high current level denotes a 100% current level. A medium current level for the row memory lines along the hard axis denotes at least a threshold level of current. A medium current applied to a row memory line and a column memory line is sufficient to program a corresponding MRME or memory element. A medium current applied to only one memory line, such as along the easy axis or hard axis, is not sufficient to program the memory element. A high current applied to a column memory line along the easy axis is sufficient to program all of the memory elements coupled along the column memory line regardless of any of the row currents.

A high current level $I_{CH}$ is applied to the column memory lines 000b, 001b, and 010b to program all of the memory elements in these columns regardless of the current level applied along any of the row memory lines. Thus, a high current applied along a column memory line is independently sufficient to program all of the multi-state magnetoresistive memory elements coupled within a predetermined range of the column memory line. A medium current level $I_{CM}$ is applied along the 011b column memory line. A medium current level is insufficient by itself to program the entire 011b column memory line. A medium current level $I_{RM}$ is applied along row memory lines 000b, 001b and 010b. The combination of $I_{CM}$ applied along the column memory line 011b and $I_{RM}$ applied along the row memory lines 000b–010b is sufficient to program the three bits 011000b, 011001b and 01101b of the memory array. The remaining memory elements of column memory line 011b along row memory lines 011b–111b receive a low level current $I_{RL}$ and thus are not programmed and remain at logic zero. The remaining column memory lines 100b–111b receive a low current level $I_{CL}$.

It is appreciated that the memory array is programmed as desired in a single write operation. A high current level asserted on any first memory line programs a subset of the memory array elements including all of the memory elements coupled within a predetermined range along that memory line. A medium current level asserted along a memory line enables individual programming of memory elements along that memory line by assertion of a medium current level along orthogonal memory lines. A low current level along a memory line ensures that its memory elements are not programmed unless a high current level is applied along an orthogonal memory line in the easy axis direction. One benefit of this method of programming a magnetoresistive memory array is the ability to program a predetermined number of memory elements or bits in the array. Also, all of the bits can be programmed to the same state in one preset or reset operation.

FIG. 11 is a schematic diagram of a portion of a memory array 1100 that includes column drive circuitry 1102 that is capable of programming all of the MRMEs in an entire column memory line in one write operation. The memory array 1100 includes a plurality of column memory lines C1, C2, etc., and a plurality of row memory lines R1, R2, etc. The column memory line C1 is coupled to the bit line terminals of MRMEs 1101, 1103, etc. It is noted that additional elements may be coupled to column memory line C1 as indicated by ellipsis on the right side. The column memory line C2 is coupled to the bit line terminals of MRMEs 1105, 1107, etc. As before, additional MRMEs may be included along memory line C2 as indicated by ellipsis on the right. The row memory line R1 is coupled to the digit line terminals of the MRMEs 1101 and 1105. Additional MRMEs may be coupled to row memory line R1 as indicated by ellipsis at the bottom. The row memory line R2 is coupled to the digit line terminals of the MRMEs 1103 and 1107. Again, additional MRMEs may be coupled to the row memory line R2 as indicated by ellipsis at the bottom.

A transistor 1109, such as a MOS-type transistor or the like, has its current path coupled between the select terminal of the MRME 1101 and ground. Another transistor 1111 has its current path coupled between the select terminal of the MRME 1103 and ground. Further, transistors 1113 and 1115 have their current paths coupled between the respective select terminals of the MRMEs 1105 and 1107 and ground. Additional transistors are coupled in like manner for each additional MRME provided in the memory array 1100. A first word line conductor, denoted WL1, is coupled to the control terminals of the transistors 1109 and 1113. Likewise, a second word line conductor, denoted WL2, is coupled to the control terminals of the transistors 1111 and 1115. Additional word line conductors are included as necessary, where there is one word line conductor for each row memory line of the memory array 1100.

A buffer 1119 has its output coupled to the R1 memory line and its input receiving the output of a current source 1117. The output of another buffer 1123 is coupled to the memory line R2 and its input is coupled to the output of another current source 1121. The inputs of the current sources 117 and 1121 are coupled to ground. A control input of the buffer 1119 receives a signal $R_{1M}$ and the control input of the buffer 1123 receives a signal $R_{2M}$. Two buffers 1125 and 1127 have their outputs coupled to the C1 memory line. Two buffers 1129 and 1131 have their inputs coupled to the C1 memory line. The outputs of two buffers 1133 and 1135 are coupled to the C2 memory line. The C2 memory line is coupled to the inputs of two buffers 1137 and 1139. Current sources 1141, 1143, 1149 and 1151 have their outputs coupled to the respective inputs of buffers 1125, 1127, 1133 and 1135. Current sources 1145, 1147, 1153 and 1155 have their inputs coupled to the outputs of buffers 1129, 1131, 1137, and 1139 respectively. The inputs of buffers 1141, 1143, 1149 and 1151 are coupled to ground. The outputs of current sources 1145, 1147, 1153 and 1155 are coupled to ground.

The buffers 1125–1139 each receive a control signal at a respective control input to activate the buffer to apply a corresponding one of the current sources 1141–1155 along a corresponding column memory line. Each control signal is according to the format $C_{NLD}$, where "N" denotes the column memory line number, "L" denotes the current level (L=low, M=medium, H=high), and "D" denotes the current direction (+=positive, −=negative), where the current direction controls the programmed logic state as logic zero or logic one. The buffer 1125 receives a control signal $C_{1H+}$, the buffer 1127 receives a control signal $C_{1M+}$, the buffer 1129 receives a control signal $C_{1H-}$, and the buffer 1131 receives a control signal $C_{1M-}$. The buffer 1133 receives a control signal $C_{2H+}$, the buffer 1135 receives a control signal $C_{2M+}$, the buffer 1137 receives a control signal $C_{2H-}$, and the buffer 1139 receives a control signal $C_{2M-}$.

It is noted that the current sources 1141–1155 each assert approximately a medium current level. In order to assert a low current level, all four current buffers coupled to a given column memory line are turned off to disconnect the four corresponding current sources. For example, to apply a low current level to the C1 memory line, the control signals $C_{1H+}$, $C_{1H-}$, $C_{1M+}$ and $C_{1M-}$ are all negated or otherwise not asserted. In order to assert a medium current level for a given direction + or −, the corresponding medium control signal is asserted. For example, to apply a positive medium current level to the C2 memory line, the control signal $C_{2M+}$ is asserted while the control signals $C_{2H+}$, $C_{2H-}$ and $C_{2M-}$ are not asserted. To apply a negative medium current level to the C2 memory line, the control signal $C_{2M-}$ is asserted instead. In order to assert a high current level for a given direction + or −, the corresponding medium and high control signals are both asserted. For example, to apply a positive high current level to the C1 memory line, the control signals $C_{1M+}$ and $C_{1H+}$ are both asserted while the control signals clip and $C_{1M-}$ are not asserted. To apply a negative medium current level to the C1 memory line, the control signals $C_{1M-}$ and $C_{1H-}$ are asserted while the control signals $C_{1M+\ and\ C1H+}$ are both not asserted.

The buffers 1119, 1123 each receive a control signal at a respective control input to activate the buffer to apply a corresponding one of the current sources 1117, 1121 along a corresponding row memory line. Each control signal is according to the format $R_{NL}$, where "N" denotes the row memory line number, and "L" denotes the current level (L=low, M=medium or threshold). The row memory lines are along the hard axis so that current direction is irrelevant. The buffer 1119 receives a control signal $R_{1M}$ that is asserted to turn on the buffer 1119 and apply the current source 1117 to the R1 memory line. The buffer 1123 receives a control signal $R_{2M}$ that is asserted to turn on the buffer 1123 and apply the current source 1121 to the R2 memory line.

In operation, the $C_{1M+}$ and $C_{1H+}$ $(or\ C1M-\ and\ C1H-)$ signals are asserted to program all of the memory elements along the C1 memory line to logic one (or logic zero), including the MRMEs 1101, 1103, etc., by applying the current sources 1141 and 1143 (or 1145 and 1147). The $C_{2M+}$ and $C_{2H+}$ (or $C_{2M-}$ and $C_{2H-}$) signals are asserted to program all of the memory elements along the C2 memory line to logic one (or logic zero), including the MRMEs 1105, 1107, etc., by applying the current sources 1149 and 1151 (or 1153 and 1155). In this manner, it is appreciated that all of the memory elements of a memory array may be programmed at once. The $C_{XM+}$ (or $C_{XM-}$) and $R_{YM}$ signals are asserted in combination to program the memory element at column X and row Y to logic one (or logic zero) by applying the corresponding current sources. For example, the MRME 1103 is programmed to logic one (or logic zero) with assertion of the $C_{1M+}$ (or $C_{1M-}$) and $R_{2M}$ signals by applying the current sources 1143 (or 1147) and 1121.

The column drive circuitry 1102 may be implemented in any one of several alternative embodiments, where the particular embodiment shown is for purposes of illustration. For example, in one embodiment, the current sources 1141 and 1143 combine as a single current source to assert a medium or high level of current in the positive direction. The buffers 1125 and 1127 may be incorporated into the current source, which receives the control signals from appropriate central logic to assert the appropriate current levels in another embodiment. Also, in yet other embodiments, the current sources 1145 and 1147 may be incorporated into a single current source or combined with the current sources 1141 and 1143 into a single programmable current source. The same is true for the other current sources and buffers of the column drive circuitry 1102. Also, similar principles apply to the row memory line current source circuitry.

In general, one or more first current sources coupled to corresponding first memory lines each coupled within a predetermined range of corresponding first subsets of memory elements along an easy axis, each includes a first state capable of applying a first current level that generates a magnetic field that is independently sufficient to program the logic state of each of the memory elements in the respective first subsets of memory elements. Each first current source may further include a second state that is capable of applying a second current level that generates a magnetic field that is insufficient alone to program the logic state of any of the multi-state magnetoresistive memory elements in its respective first subset. The memory array may include one or more second memory lines coupled within a predetermined range of respective second subsets of the memory elements along the hard axis, where each second memory line includes at least one of the memory elements of a respective one of the first subsets. One or more second current sources, each coupled to a respective second memory line, applies a third or threshold current level along the respective second memory line. In this manner, the second current level of a first current source and the third current level of a second current source is sufficient to program the logic state of and memory elements in both first and second corresponding subsets.

The first and second current sources and memory lines may correspond to column and row sources and memory lines, respectively. Control logic may be provided to control the current sources to program the magnetoresistive memory array in one write operation. The control logic controls at least one column current source into the first state to program the memory elements in corresponding column memory lines. The control logic controls at least one column current source into the second state to program the memory elements in at least one partial column memory line. The control logic also controls at least one row current source into the third state to program common memory elements in the partial column memory line.

Figure 12:
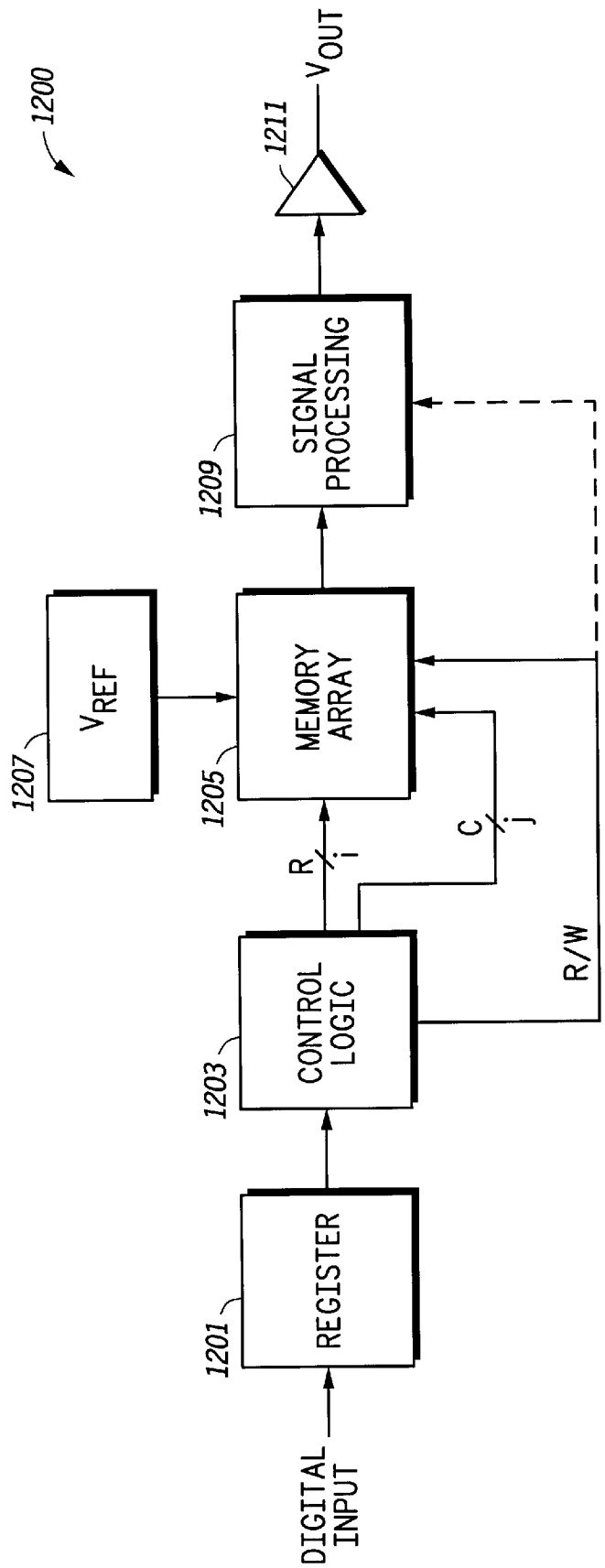
FIG. 12 is a block diagram of a digital-to-analog converter (DAC) using magnetoresistive memory technology.

FIG. 12 is a block diagram of a digital-to-analog converter (DAC) 1200 using magnetoresistive memory technology. A digital input is applied to an optional register 1201 for storing the digital input. The register 1201 is read by control logic 1203, which asserts a plurality (i) of row (R) signals and a plurality j) of column (C) signals to a memory array 1205 comprising MRMEs, further described below. The control logic 1203 asserts a read/write (R/W) signal to the memory array 1205 and optionally to a signal processing block 1209. A voltage reference source 1207 applies a $V_{REF}$ reference voltage signal to the memory array 1205. The output of the memory array 1205 is provided to the signal processing block 1209, which asserts an analog signal to a buffer or amplifier 1211, which further provides an analog output signal $V_{OUT}$.

The control logic 1203 is configured to assert the plurality of row and column signals to the memory array 1205 in an appropriate manner to program a number of memory cells within the memory array 1205 that is proportional to the digital input value. For example, the memory array 1205 may initially be reset to all logic zeros, and the control logic 1203 programs a number of logic ones into the memory array 1205 that is proportional to the digital input value. In one embodiment, the control logic 1203 is configured to assert necessary column and row current signals along column and row memory lines of the memory array 1205. Alternatively, the memory array 1205 includes controllable current sources and optional buffers or current drivers, where the control logic 1203 asserts appropriate control signals, such as in a similar manner as described above for the memory array 1100.

As described below, the memory array 1205 may be configured in a similar manner as an MRAM, where column and row signals are applied in successive write operations to program the memory array 1205. Alternatively, the memory array 1205 may be configured in a similar manner as the memory array 1100 with the column drive circuitry 1102 that includes high current sources to enable programming in a single write operation. The control logic 1203 thus asserts the R/W signal low for one or more successive operations to program the memory array 1205, and then asserts the R/W signal high to enable the memory array 1205 to be read by the signal processing block 1209. The R/W signal is optionally provided to the signal processing block 1209 to indicate when to perform a read operation. As described further below, a source, such as the voltage source 1207 or the like, selectively applies a reference signal to the memory elements in the memory array 1205. An output terminal of the memory array 1205 combines signals developed by each of the memory elements resulting from application of the reference signal to develop an analog output signal.

The signal processing block 1209 may be configured to perform any one or more of several functions. One function is to read the memory array 1205 to receive an analog current or voltage signal. The signal processing block 1209 may further perform amplification (or attenuation) functions to achieve the appropriate scale of the $V_{OUT}$ signal at the output. The signal processing block 1209 may further perform filtering functions depending on particular applications. For example, the signal processing block 1209 may smooth out an analog curve based on a plurality of digital inputs to remove discrepancies or out of range values. Further, the signal processing block 1209 may perform a function based on a change of state of any of the memory elements within the memory array 1205. Additionally or in the alternative, the signal processing block 1209 may perform a sequential or binary search of the memory array 1205 to identify a threshold condition.

Figure 13A:
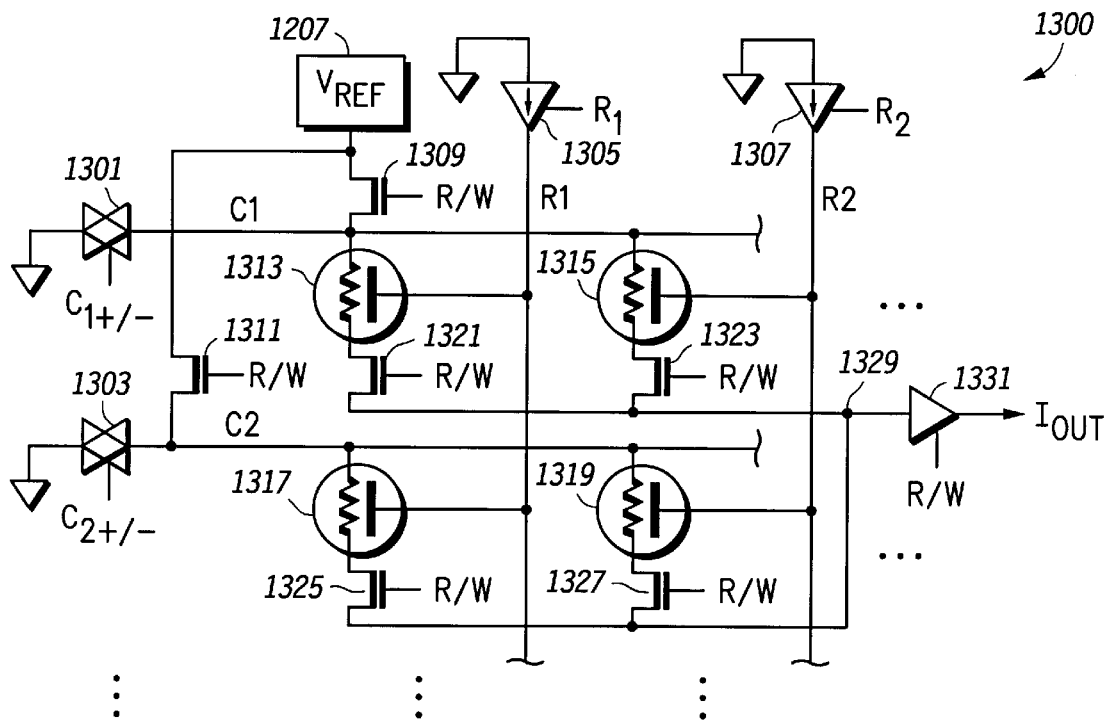
FIG. 13A is a schematic diagram of a portion of a memory array that may be utilized as the memory array of the DAC of FIG. 12.

FIG. 13A is a schematic diagram of a portion of a memory array 1300 that may be utilized as the memory array 1205 for the DAC 1200. A bidirectional current source 1301 is coupled between ground and a column memory line C1 of the array 1300. The bidirectional current source 1301 is controlled by a signal $C_{1+/-}$, which has three states $C_{1+}$ for logic one, $C_{1-}$ for logic zero or not asserted to maintain the present state of memory elements in the C1 memory line. Another bi-directional current source 1303 is coupled between ground and a memory line C2 and receives a control signal $C_{2+/-}$, which also has three states and operates in a similar manner as the $C_{1+/-}$ signal. A current source 1305 is coupled between ground and a memory line R1 and selectively applies a medium or threshold current level upon assertion of a control signal $R_1$ and a current source 1307 is coupled between ground and a memory line R2 and selectively applies a medium or threshold current level along the R2 memory line upon assertion of a control signal $R_2$. As before, additional column and row memory lines may be included as indicated by ellipses.

The reference voltage source 1207 is coupled to one current terminal of transistors 1309, 1311. The other current terminal of the transistor 1309 is coupled to the C1 memory line and the other current terminal of the transistor 1311 is coupled to the C2 memory line. The control terminals of the transistors 1309, 1311 receive the R/W signal. The transistors 1309, 1311 serve as source switch devices to selectively apply the $V_{REF}$ signal. MRMEs 1313 and 1315 have their bit line terminals coupled to the C1 memory line and their digit line terminals coupled to the R1 and R2 memory lines, respectively. MRMEs 1317 and 1319 have their bit line terminals coupled to the C2 memory line and their digit line terminals coupled to the R1 and R2 memory lines, respectively. The select terminal of the MRME 1313 is coupled to one current terminal of a transistor 1321. The select terminal of the MRME 1315 is coupled to one current terminal of a transistor 1323. The select terminal of the MRME 1317 is coupled to one current terminal of a transistor 1325. The select terminal of the MRME 1319 is coupled to one current terminal of a transistor 1327. The other current terminals of the transistors 1321–1327 are coupled to a summing junction 1329. The transistors 1321–1327 are read switch devices that are selective activated to perform a read operation of the memory array 1300. The R/W signal is provided to the control terminal of each of the transistors 1321–1327. An output buffer 1331 has its input coupled to the summing junction 1329 and its output providing an output current signal $I_{OUT}$. The buffer 1331 receives the R/W signal at its control input.

In operation, the R/W signal is asserted low for a write operation to disconnect the reference voltage source 1207 and to disconnect the summing junction 1329. Assertion of the $C_{X+/-}$ and $R_Y$ control signals in combination during a write operation enables programming of a corresponding memory element along the X column memory line and the Y row memory line in a similar manner as previously described. When the R/W signal is asserted high for a read operation, the $V_{REF}$ signal is applied to the C1, C2, etc. memory lines. The transistors 1321–1327 are activated during a read operation to enable current to flow from the voltage source 1207 through the memory elements of the memory array 1300 to the activated buffer 1331 via the summing junction 1329 to develop the $I_{OUT}$ signal.

Figure 13B:
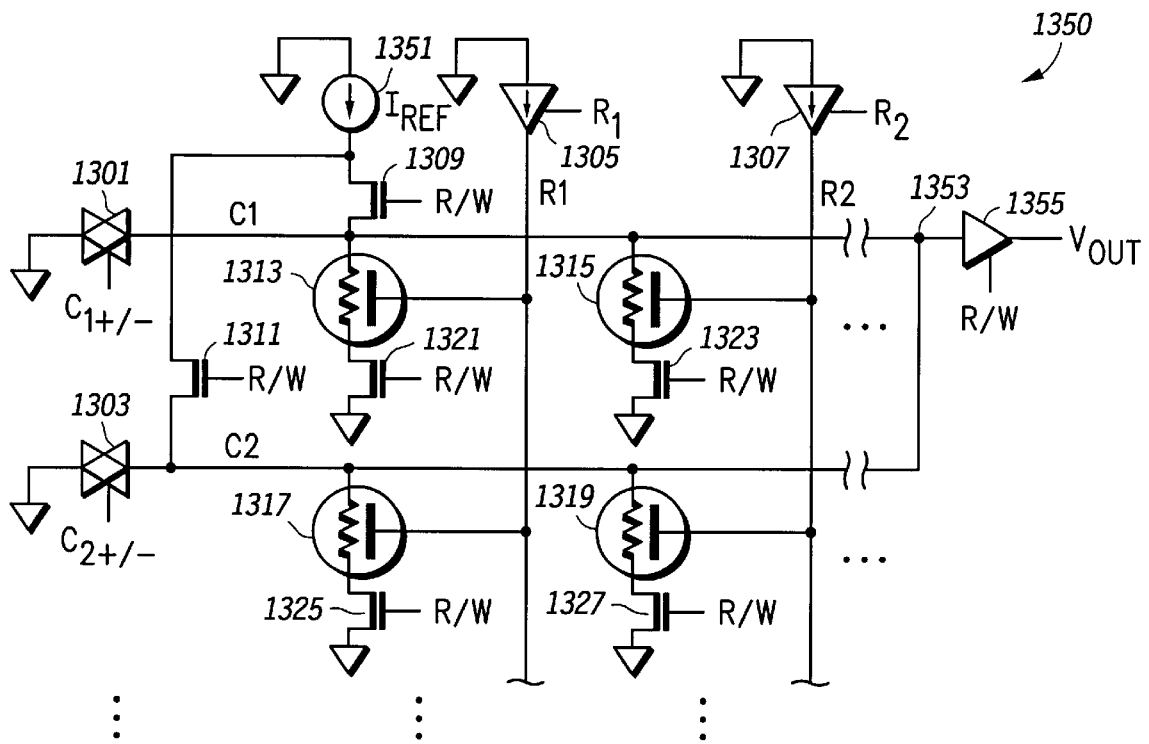
FIG. 13B is a schematic diagram of a memory array according to an alternative embodiment that also may be utilized as the memory array of the DAC of FIG. 12.

FIG. 13B is a schematic diagram of a memory array 1350 according to an alternative embodiment. The memory array 1350 is substantially similar to the memory array 1300 except that the voltage reference source 1207 is replaced by a current reference source 1351 having its input coupled to ground and its output coupled to a current terminal of each of the transistors 1309 and 1311. Also, the voltage source 1207 is replaced by the current source 1351. Similar components assume identical reference numerals. Further, the transistors 1321–1327 are coupled between their respective MRMEs and ground. The column memory lines are coupled at a summing junction 1353, which is coupled to the input of a buffer 1355. The output of the buffer 1355 asserts a voltage output signal $V_{OUT}$. Programming operation during a write operation of the memory array 1350 is substantially similar as the memory array 1300. When the R/W signal is asserted to indicate a read operation, however, the current source 1351 asserts a reference current $I_{REF}$ to the memory elements of the memory array 1350 to develop a voltage at the summing junction 1353 at the input of the buffer 1355. The buffer 1355 develops the $V_{OUT}$ signal.

The DAC 1200 is able to use either of the memory arrays 1300, 1350 except that the signal processing block 1209 is correspondingly implemented to receive either the $I_{OUT}$ current output or the $V_{OUT}$ voltage output for developing the analog output voltage signal $V_{OUT}$ at the output of the buffer 1211. It is noted that the memory arrays 1300 and 1350 are to be programmed in successive steps with multiple assertions of a write signal during a write operation prior to a read operation. Thus, separate read and write signals may be used with corresponding circuitry instead of a single R/W signal as shown. Nonetheless, the R/W signal illustrates the inventive concepts of embodiments of the invention.

Figures 14, 15A:
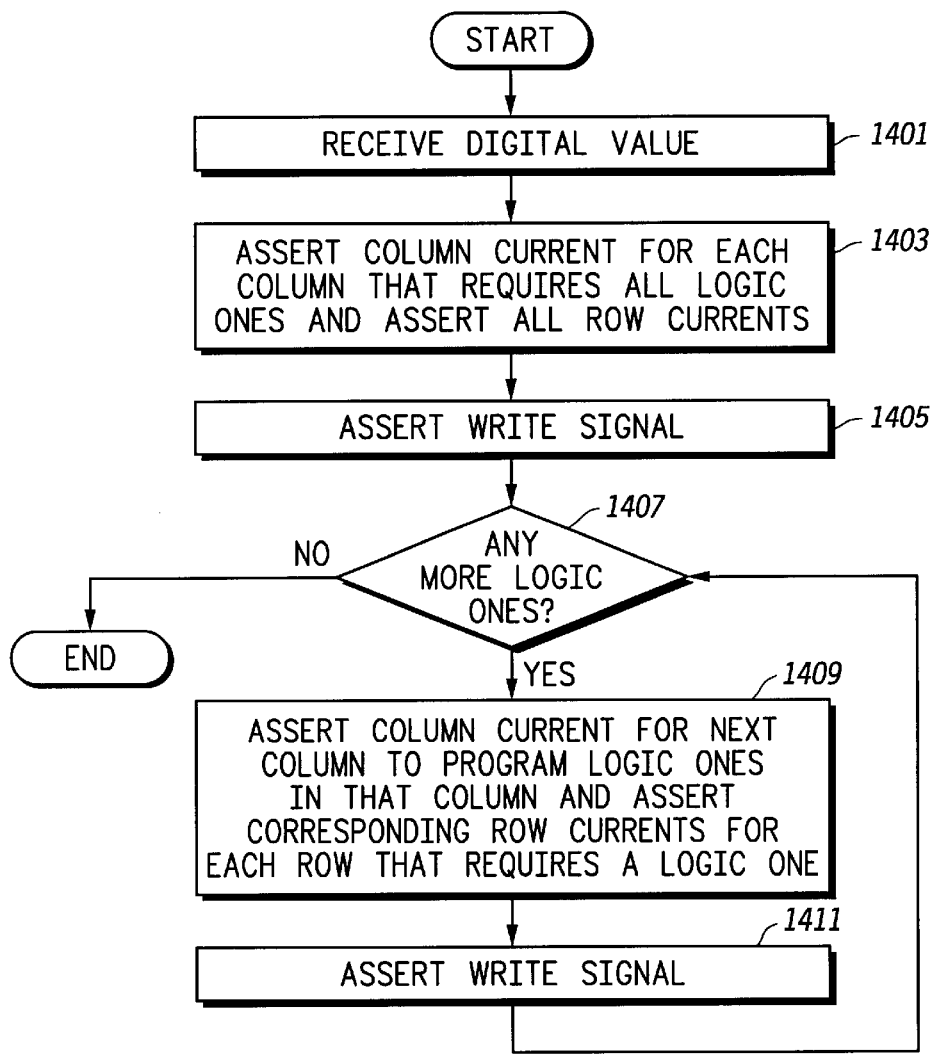

FIG. 14 is a flow chart diagram illustrating a multiple step write operation of the DAC 1200 for programming the memory array 1205 utilizing either of the memory arrays 1300 or 1350 or any other suitable memory array with magnetoresistive memory technology. FIGS. 15A and 15B are chart diagrams similar to the chart of FIG. 10 illustrating programming of the memory array 1205 by the control logic 1203. For purposes of illustration, an 8×8 memory array with 64 memory elements is shown. Again, column addresses 000b–111b are shown along a vertical side of the chart for the 8 column memory lines, and row addresses 000b–111b are shown along the top side for the 8 row memory lines. Asserted current levels for the column memory lines are shown on the right vertical side and asserted row currents are shown along the bottom side. A current $I_{CM}$ denotes a medium current level and a current $I_{CL}$ denotes low or no current along the corresponding column memory line. A current $I_{RM}$ denotes a medium or threshold current level and a current $I_{RL}$ denotes low or no current along the corresponding row memory line. FIGS. 15A and 15B should be referenced in conjunction with FIG. 14.

At a first block 1401, a digital value is received by the control logic 1203 either directly or from the register 1201. At next block 1403, a column current signal $I_{CM}$ is asserted for each column memory line that requires all logic ones. Also, a row current signal $I_{RM}$ is asserted for all row memory lines in order to program each column memory line receiving $I_{CM}$ with all logic ones. The control logic 1203 asserts the appropriate column and row control signals to achieve this purpose. As illustrated in FIG. 15A, a current $I_{CM}$ is asserted along the column memory lines 000b, 001b and 010b. A column current $I_{CL}$ is asserted along remaining column memory lines 011b–111b. A row current $I_{RM}$ is asserted along all row memory lines 000b–111b. If the memory arrays 1300 or 1350 were expanded to an 8×8 configuration, the control logic 1203 asserts column control signals $C_{1+}$, $C_{2+}$ and $C_{3+}$ and all row control signals $R_1$–$R_8$. At next step 1405, the write signal (R/W) is asserted in order to program the memory array 1205. In this manner, column memory lines 000b–010b are programmed with all logic ones.

At next step 1407, it is determined whether any more logic ones are to be programmed within the memory array 1205. If so, operation proceeds to next block 1409, in which a column current $I_{CM}$ is asserted for the next column in which logic ones are to be programmed. With reference to FIG. 15B, column memory line 011b receives a current $I_{CM}$ to program one or more logic ones. Also at block 1409, a row current signal $I_{RM}$ is asserted for each row memory line in which a logic one is to be programmed along the column memory line 011b. Row memory lines 000b–010b are to be programmed with a logic one so that a row current $I_{RM}$ is asserted on these rows. The remaining column memory lines 100b–111b receive low current or $I_{CL}$ and the remaining row memory lines 011b–111b receive low current or $I_{RL}$. The control logic 1203 asserts the necessary control signals to achieve this purpose. At next block 1411, the write signal is asserted to complete this write operation. In this manner, a logic one is programmed into address 011000b, 011001b and 011101b.

It is noted that the column memory lines 000b–010b have already been programmed so that the current applied along these columns may either be zero or a positive medium level as indicated by $I_{CX}$. It is noted, however, that these columns should not receive a current of $I_{C-}$ to prevent a logic zero from being programmed into any of the MRMEs along these column memory lines. From block 1411, operation returns to block 1407 to determine if any more logic ones are to be programmed. If so, operation iteratively loops between steps 1407 to 1411 until all logic ones within the memory array 1205 are programmed. Otherwise, operation is completed and the memory array 1205 is programmed. It is noted that operation is substantially similar to program logic zeroes except that opposite current directions are utilized.

FIG. 15C is a chart diagram similar to the charts shown in FIGS. 15A and 15B illustrating an alternative embodiment to demonstrate flexibility of configuration. In this case, rather than programming three logic ones into the column memory line 011b, two logic ones at row memory lines 000b and 001b are programmed instead during a prior iteration. In the next iteration as shown in FIG. 15C, an additional logic one is programmed at address 100000b by applying a column current $I_{CM}$ along column memory line 100b and by applying a row current $I_{RM}$ along row memory line 000b. The remaining row memory lines 001b–111b receive low current $I_{RL}$ and the column memory lines 011b and 101b–111b receive low current or $I_{CL}$. Again, the column currents at column addresses 000b–010b are at $I_{CX}$.

Figure 16:
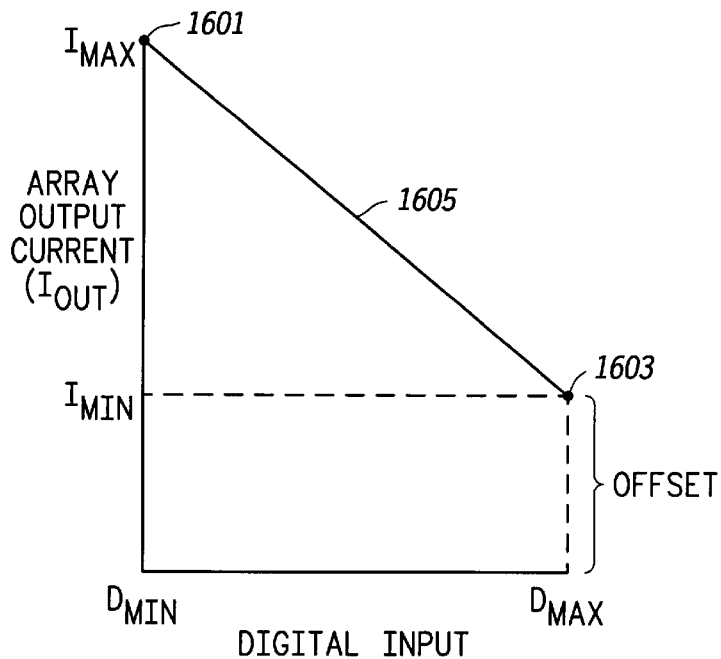
FIG. 16 is a graph diagram illustrating the inputs and output of the memory array of FIG. 13A.

FIG. 16 is a graph diagram illustrating the inputs and output of the memory array 1300 of FIG. 13A. The output current $I_{OUT}$ is plotted along the vertical or Y axis and the digital input value is plotted along the horizontal or X axis. For a minimum digital input ($D_{MIN}$), the memory array 1300 is programmed with all zeros or a greater number of zeros so that the resistance of the corresponding MRMEs is $R_0$. Upon application of the $V_{REF}$ signal, a maximum current ($I_{MAX}$) is received at $I_{OUT}$ for the minimal digital input $D_{MIN}$ as shown at 1601. Further, as shown at 1603, for a maximum digital input ($D_{MAX}$) a greater number of logic ones are programmed into the memory array 1300 resulting in a greater number of the MRMEs of the memory array 1300 programmed with resistance $R_1$. A minimum amount of current ($I_{MIN}$) is thus provided as $I_{OUT}$ as shown at 1603 for the maximum digital input $D_{MAX}$. It is further appreciated as shown along the linear line 1605 that the memory array output current $I_{OUT}$ is proportional to the digital input value resulting in a linear DAC 1200.

The signal processing block 1209 is configured to receive the $I_{OUT}$ signal and provide signal conditioning as desired. For example, the OFFSET current shown in FIG. 16 may be removed to provide proportionality between the input and output. Further, the signal processing block 1209 may provide any necessary amplification, attenuation and/or filtering of the $I_{OUT}$ signal as desired depending upon the particular system implementation or configuration.

Figure 17:
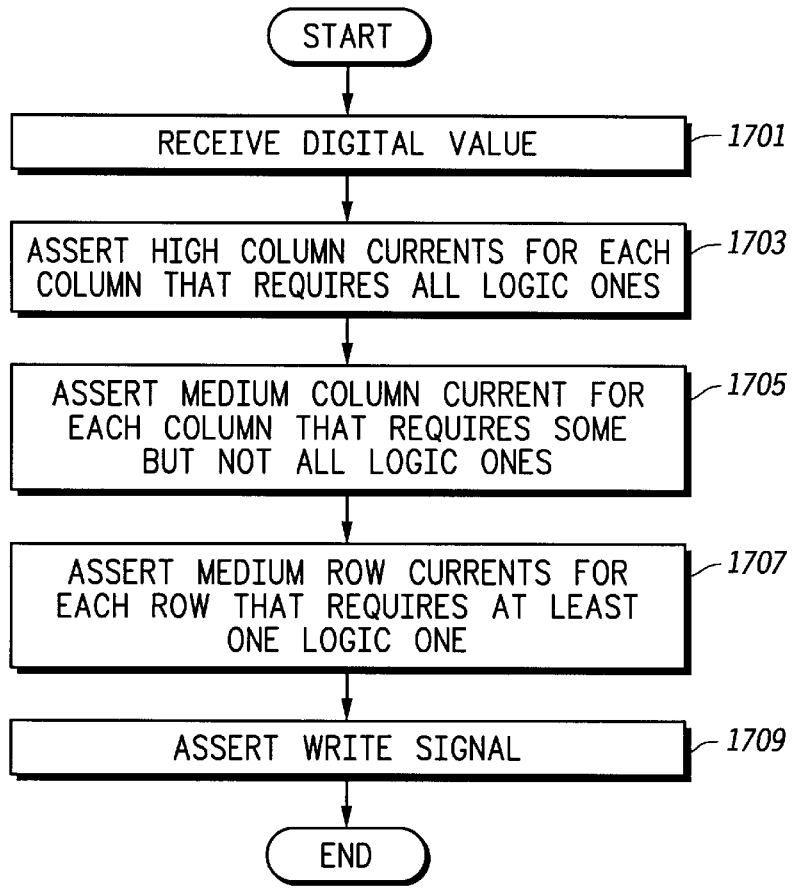
FIG. 17 is a flow chart diagram illustrating operation of the DAC of FIG. 12 implemented with a memory array similar to the memory arrays of FIGS. 13A or 13B except utilizing the column drive circuitry of the memory array of FIG. 11.

FIG. 17 is a flow chart diagram illustrating operation of the DAC 1200 implemented with a memory array similar to the memory arrays 1300, 1350 except utilizing the column drive circuitry 1102 of the memory array 1100. Thus, an entire column memory line may be programmed utilizing a high column current regardless of row currents. At first block 1701, the control logic 1203 receives the digital value either directly or from the register 1201 as before. At next block 1703, a high column current signal is asserted onto each column memory line that requires all logic ones to be programmed. At next block 1705, a medium column current signal is asserted onto each column memory line that requires some but not all logic ones. At next block 1707, a medium or threshold row current signal is asserted onto each row that requires at least one logic one. At next block 1709, the write signal is asserted to program the memory array 1205.

As previously described, the control logic 1203 is configured to assert the appropriate row and column control signals to control proper assertion of column and row currents to achieve proper programming. The advantage of the embodiment illustrated by the flow chart of FIG. 17 and utilizing the column drive circuitry 1102 is that the entire memory array 1205 may be programmed with one write operation rather than with multiple iterative steps as illustrated by the flow chart of FIG. 14. For example, the write signal may be asserted once to program the memory array, followed by assertion of the read signal for a read operation. A single R/W signal may be utilized in this manner.

Figure 18:
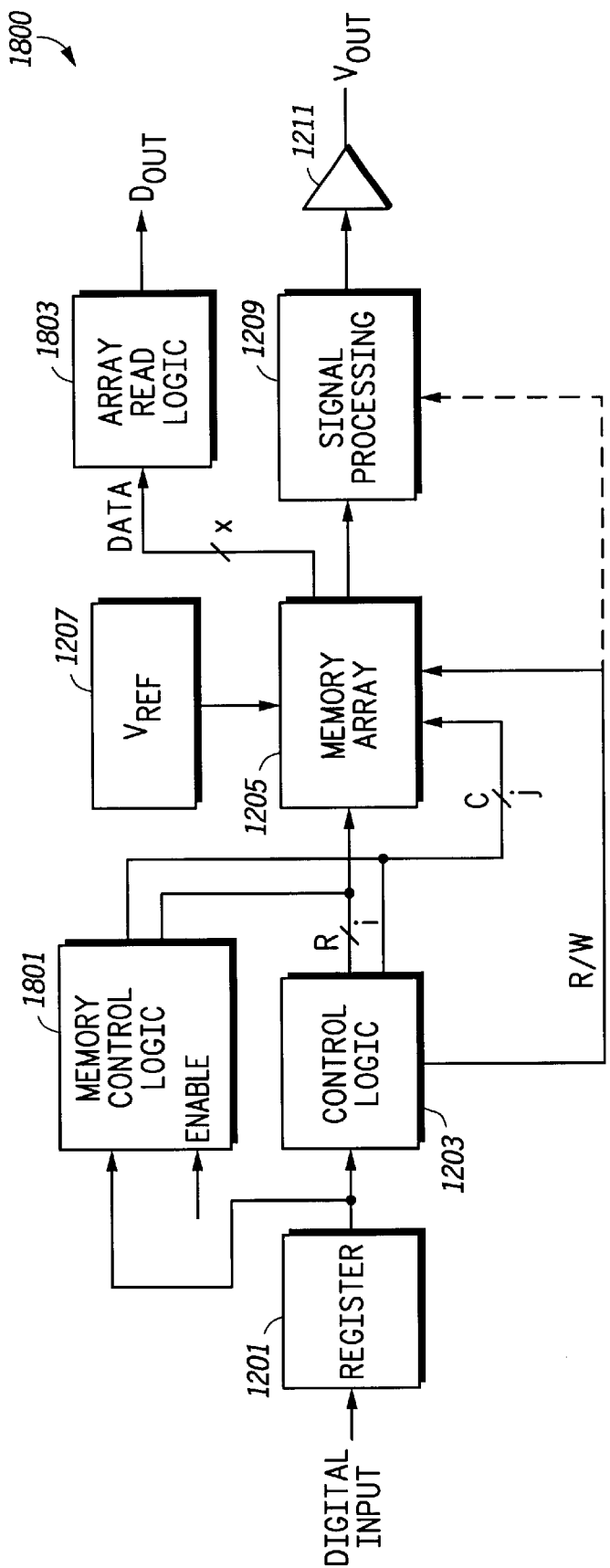
FIG. 18 is a block diagram of a DAC/memory similar to the DAC of FIG. 12 except including additional logic or circuitry to utilize the DAC memory array as a storage memory.

FIG. 18 is a block diagram of a DAC/memory 1800 similar to the DAC 1200 except including additional logic or circuitry to utilize the memory array 1205 as a storage memory rather than for DAC functions. Similar components assume identical reference numbers. The DAC/memory 1800 includes memory control logic 1801 that receives an enable signal to enable the memory array 1205 to be used as a memory device. Also, array read logic 1803 is coupled to the DATA output of the memory array 1205 to provide a digital output signal $D_{OUT}$. In this manner, a digital input provided to the register 1201 is provided to the memory logic 1801, which programs the digital input value into the memory array 1205 in a standard fashion for MRAMS. Array read logic 1803 reads the data from the memory array 1205 to assert the corresponding digital output $D_{OUT}$ that corresponds to the digital input. In this manner, the memory array 1205 serves a dual function.

Figure 19:
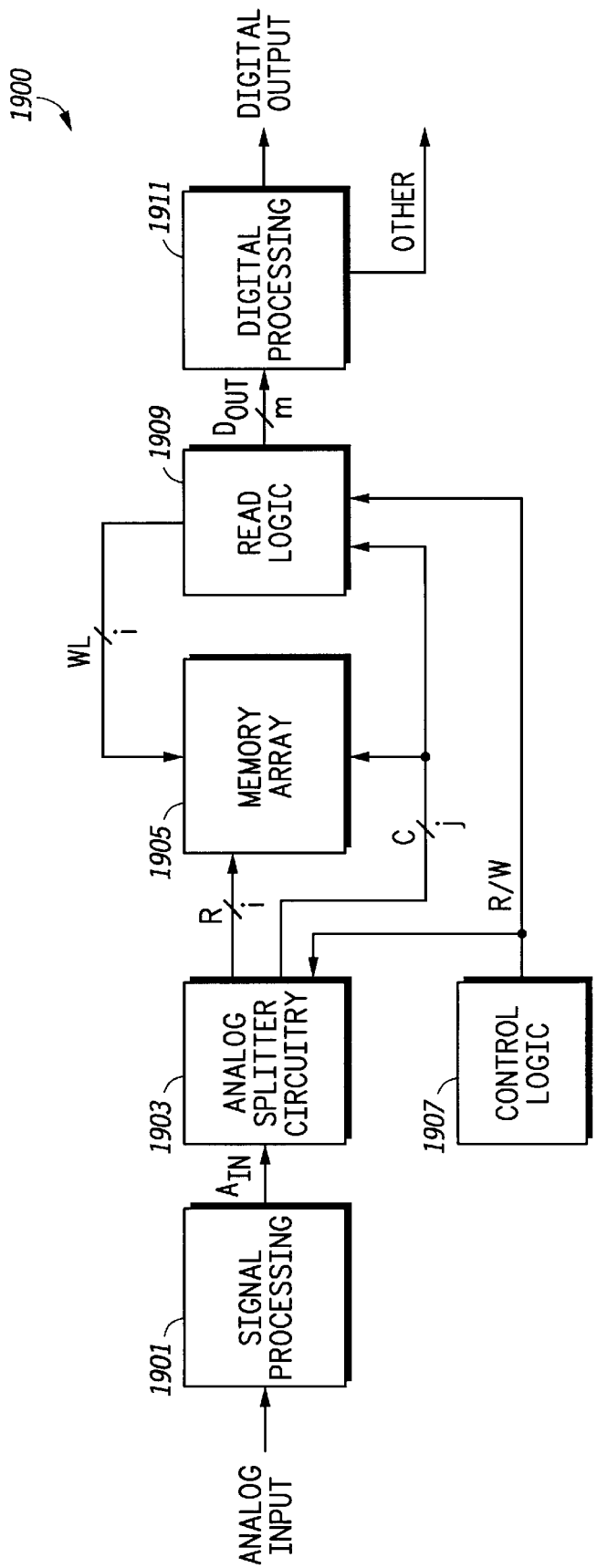
FIG. 19 is a block diagram of an analog-to-digital converter (ADC) a utilizing magnetoresistive memory technology.

FIG. 19 is a block diagram of an analog-to-digital converter (ADC) 1900 utilizing magnetoresistive memory technology. An analog input signal is provided to a signal processing block 1901, which may include any filtering circuitry or the like and which provides a corresponding analog signal $A_{IN}$ to the input of analog splitter circuitry 1903. The analog splitter circuitry 1903, in response to a R/W signal from control logic 1907 indicating a write operation, asserts a plurality (i) of row (R) and a plurality (j) of column (C) current signals to a memory array 1905. The memory array 1905 includes MRME memory elements as previously described. As described further below, the analog splitter circuitry 1903 splits the $A_{IN}$ current among the row and column memory lines of the memory array 1905 in order to program a proportional number of logic bits within the memory array 1905 corresponding to the analog input signal. Assuming that the memory array 1905 is initially reset to all logic zeros, then the analog splitter circuitry 1903 programs a proportional number of logic ones in the memory array 1905.

In response to a read operation indicated by the control logic 1907, read logic 1909 asserts a plurality (i) of word line (WL) signals to the memory array 1905 and reads the number of bits along each column memory line of the memory array 1905. The read logic 1909 develops a digital output signal $D_{OUT}$ with "m" bits, where the $D_{OUT}$ signal is provided to a digital processing block 1911. The digital processing block 1911 may simply provide the digital output signal that corresponds to the analog input signal. In alternative embodiments, however, the digital processing block 1911 may perform other operations such as filtering functions, determining any change in state of the memory array 1905 or determining a threshold value in the memory array 1905, etc. The digital processing block 1911 may perform a sequential or binary search of the memory array 1905 to determine the $D_{OUT}$ signal or otherwise to identify a threshold condition. In this manner, the digital processing block 911 may assert OTHER signals indicating a threshold, a memory change, etc.

Figure 20:
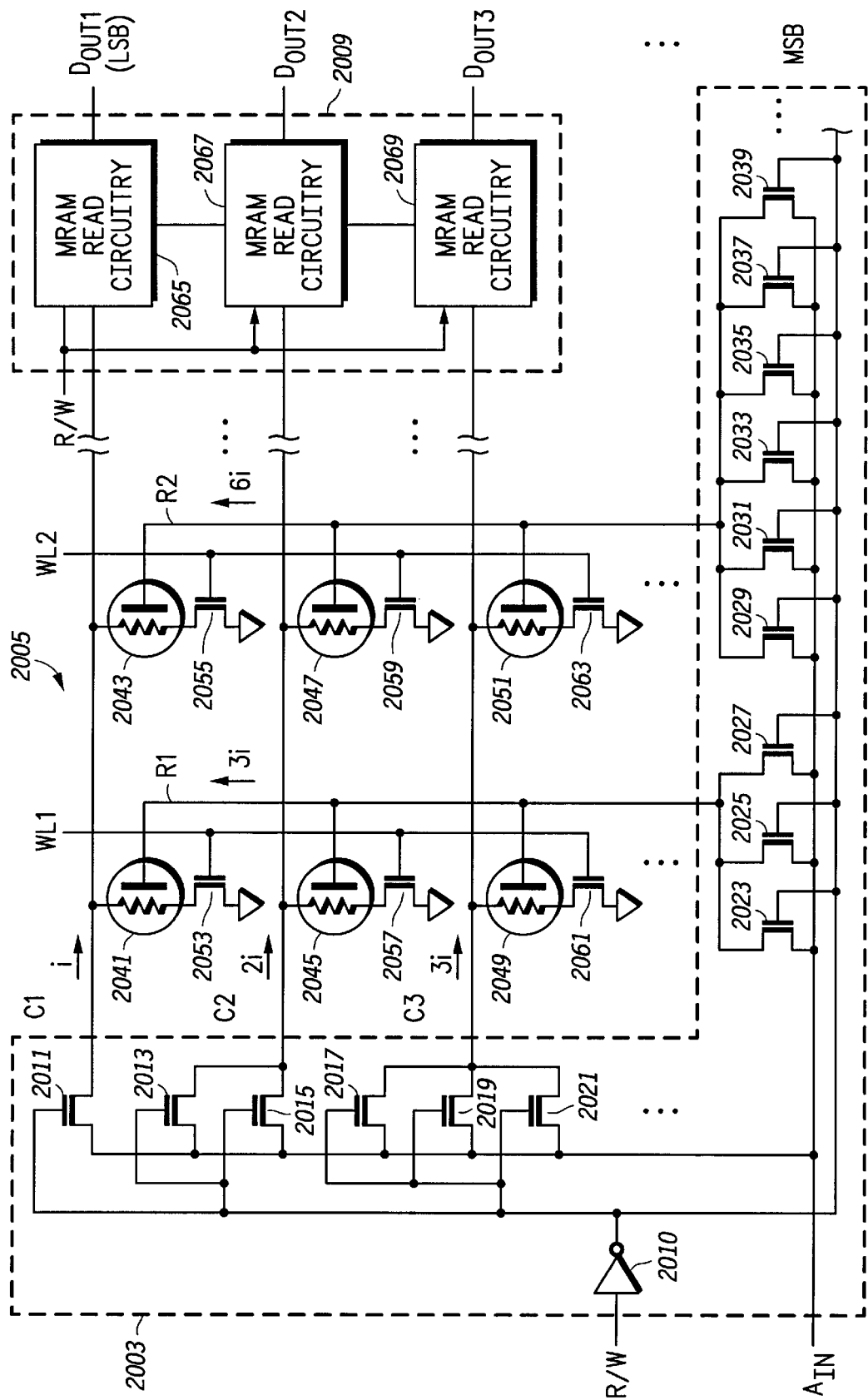
FIG. 20 is a schematic diagram illustrating an exemplary embodiment of the analog splitter circuitry, the memory array and the read logic of FIG. 19.

FIG. 20 is a schematic diagram illustrating an exemplary embodiment of the analog splitter circuitry 1903, the memory array 1905 and the read logic 1909. In particular, analog splitter circuitry 2003 corresponds to the analog splitter circuitry 1903, a memory array 2005 corresponds to the memory array 1905 and read logic 2009 corresponds to the read logic 1909. The analog splitter circuitry 2003 includes a plurality of transistors, such as MOS-type transistors or the like, that proportionately splits the $A_{IN}$ signal to program a proportionate number of memory elements within the memory array 2005.

The R/W signal is provided to the input of an inverter 2010, which has its output coupled to the control terminal of each of a plurality of transistors 2011, 2013, 2015, 2017, 2019, 2021, 2023, 2025, 2027, 2029, 2031, 2033, 2035, 2037, and 2039 of the analog splitter circuitry 2003. One current terminal of all of the transistors 2011–2039 is coupled to receive the $A_{IN}$ signal. The other current terminal of the transistor 2011 is coupled to a memory line C1 of the memory array 2005. The other current terminals of the next two transistors 2013, 2015 are coupled to the next memory line C2. The other current terminal of the next three transistors 2017–2021 are coupled to a third column memory line C3. The structure may continue in similar manner for four, five, six, etc. groups of transistors coupled for each consecutive column memory line C4, C5, C6, etc. The memory array 2005 only shows three columns and two rows for purposes of simplicity, where ellipses indicate that array may include additional elements.

The number of transistors utilized for the first row memory line R1 is the same as the number of transistors utilized for the last column memory line $C_n$, where "n" is the number of column memory lines. For n=3 for the simplified memory array 2005, the next three transistors 2023–2027 have their other current terminals coupled to the first row memory line R1 of the memory array 2005. For each adjacent and sequential row memory line, the number of transistors increase by n. Thus, the next six transistors 2029–2039 have their other current terminals coupled to the second row memory line R2 of the memory array 2005. For any additional row memory lines R3, R4, R5, etc. the number of transistors continues to increase to 9, 12, 15, etc. Again, only three columns and two rows are shown for purposes of simplicity.

Within the memory array 2005, two MRMEs 2041 and 2043 have their bit line terminals coupled to the C1 column memory line and their digit line terminals coupled to respective row memory lines R1 and R2. The bit line terminals of MRMEs 2045 and 2047 are coupled to the C2 column memory line and the digit line terminals of the MRMEs 2045, 2047 are coupled to the respective row memory lines R1 and R2. The bit line terminals of MRMEs 2049 and 2051 are coupled to the C3 column memory line and the digit line terminals of the MRMEs 2049 and 2051 are coupled to respective row memory lines R1 and R2. Additional MRMEs may be added for each row and column memory line and are coupled in a similar manner.

A plurality of transistors 2053, 2055, 2057, 2059, 2061, and 2063 each have one current terminal coupled to ground and the other current terminal coupled to the select terminal of a corresponding one of the MRMEs 2041–2051. In particular, the transistor 2053 is coupled to MRME 2041, the transistor 2055 is coupled to the MRME 2043, the transistor 2057 is coupled to the MRME 2045, the transistor 2059 is coupled to the MRME 2047, the transistor 2061 is coupled to the MRME 2049 and the transistor 2063 is coupled to the MRME 2051. Of course, an additional transistor is provided for each additional MRME within the memory array 2005. The control terminal of each of the transistors within each row is coupled to a corresponding word line signal. In particular, the transistors 2053, 2057, 2061 within the R1 memory line are coupled to a first word line signal WL1. The control terminals of the transistors 2055, 2059 and 2063 are coupled to a next word line signal WL2. An additional word line signal is provided for each additional row memory line.

Separate MRAM read circuitry within the read logic 2009 is provided for each of the column memory lines of the memory array 2005. In particular, a first read circuitry 2065 is coupled to read the C1 memory line, a second MRAM read circuitry 2067 is coupled to read the C2 memory line and a third MRAM read circuitry 2069 is coupled to read the C3 memory line. Of course, an additional MRAM read circuitry is provided for each additional column memory line within the memory array 2005. Each MRAM read circuitry 2065–2069 receives the R/W signal and asserts a corresponding bit of the $D_{OUT}$ signal. The MRAM read circuitry 2065 asserts the LSB $D_{OUT1}$, the MRAM read circuitry 2067 asserts the next bit $D_{OUT2}$, the MRAM read circuitry 2069 asserts the third digital output bit $D_{OUT3}$, etc. where the MSB of the memory array 2005 is a memory element coupled to the highest row and column memory line. The read logic 2009 digitally combines the programmed logic states of the memory elements along respective column memory lines to achieve a respective bit of the $D_{OUT}$ signal.

The transistors 2011–2039 of the analog splitter circuitry 2003 are each implemented in a substantially equivalent manner with essentially the same area to handle substantially the same amount of current of the $A_{IN}$ signal. For the 3×2 configuration of the memory array 2005, the current asserted along the C1 memory line is "i", the current asserted along the C2 memory line is 2i, the current asserted along the C3 memory line is 3i, etc. The current asserted along the R1 memory line is 3i (for the simplified memory array) and the current asserted along the R2 memory line is 6i. Thus, the analog splitter circuitry 2003 divides the $A_{IN}$ signal into increasingly discrete signal levels along the column and row memory lines. The transistors 2011–2039 are divided into respective groups, each group forming a current device coupled to a corresponding column or row memory line to carry a proportionally increasing current level between consecutive column and row memory lines. In this manner, the $A_{IN}$ signal is distributed within the memory array 2005 as 15i, or $A_{IN}$=15i or i=$A_{IN}$/15. Thus, for the six memory element configuration of the memory array 2005, the input current AIN is split proportionally among the memory lines C1, C2, C3, R1, R2 as i, 2i, 3i, 3i, 6i, respectively. The MRME 2041 receives a total current of 4i, the MRME 2045 receives a current of 5i, the MRME 2049 receives a current of 6i, the MRME 2043 receives a total current of 7i, the MRME 2047 receives a total current of 8i, and the MRME 2051 receives a total current of 9i. In this manner, the MRMEs 2041–2051 receive a proportionately increasing amount of current from one row memory line to the next and from one column memory line to the next.

The signal processing block 1901 is configured to either amplify or attenuate the analog input signal into the appropriate range to be split among the memory array 1905 by the analog splitter circuitry 1903 to program a proportional number of bits. The configuration of the analog splitter circuitry 2003, the memory array 2005 and the read logic 2009 is simplified in order to illustrate the primary concept. It is noted, however, that the least significant column memory line C1 may have a plurality of transistors splitting the current rather than one, where the number of transistors increase by one for adjacent columns memory lines C2, C3, etc. The drive circuitry for the row memory lines R1, R2 etc. are distributed appropriately to provide a relatively linear configuration across the memory array 2005. The signal processing block 1901 is thus configured to provide the appropriate range of the $A_{IN}$ signal to program a proportional number of bits across the memory array 2005 during a write operation.

It is noted that each of the transistors 2011–2039 are substantially equivalent for carrying substantially the same amount of current as each of the other transistors. In an alternative embodiment, a single or current transistor may be provided for each column memory line and each row memory line, where the physical area of the transistor is proportionately scaled to draw the proportionate amount of current for programming the memory array 2005 in a linear manner.

When the control logic 1907 asserts the R/W signal high to indicate a read operation, the drive circuitry transistors 2011–2039 are shut off, and the read logic 2009 asserts the word line signals WL1, WL2, etc. to activate the transistors 2053–2063 within the memory array 2005. The read logic 2009A further causes a current or voltage source (not shown) to be asserted to the memory array 2005 in a similar manner as previously described. The read logic 2009 then senses the current or voltage provided at each column memory line C1, C2, C3, etc. In particular, the MRAM read circuitry 2065 reads the C1 memory line, the MRAM read circuitry 2067 reads the C2 memory line, the MRAM read circuitry 2069 reads the C3 memory line and so on. Thus, each RAM read circuitry 2065–2069 digitally combines the programmed logic states of the memory elements along respective column memory lines to achieve a respective bit of the $D_{OUT}$ signal. In one embodiment the respective MRAM read circuitry counts the memory elements having a predetermined logic state, such as logic one. Alternatively, the read logic 2009 uses a binary or sequential search to count logic states.

Figure 21:
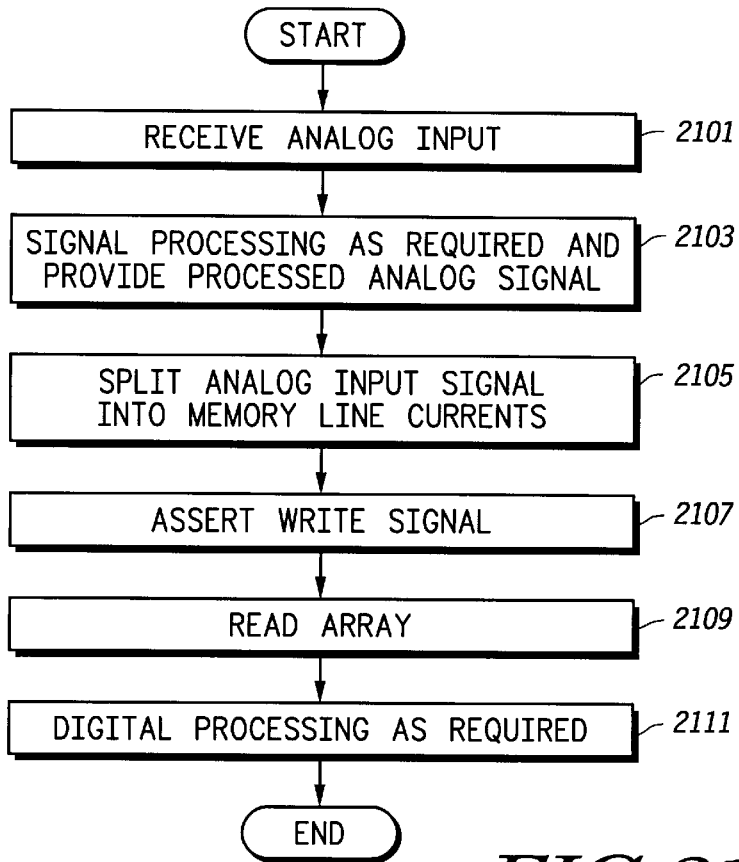
FIG. 21 is a flow chart diagram illustrating operation of the ADC of FIG. 19.

FIG. 21 is a flow chart diagram illustrating operation of the ADC 1900. In a first block 2101, the analog input signal is received at the signal processing block 1901. At a next block 2103, signal processing is performed by the signal processing block 1901 as previously described, and the signal processing block 1901 asserts the $A_{IN}$ signal. At next block 2105, the analog splitter circuitry 1903 splits the $A_{IN}$ signal into a plurality of row and column memory line currents that are applied to the memory array 1905. At next block 2107, the write signal is asserted to program the memory elements of the memory array 1905. At next block 2109, the R/W signal is asserted to initiate a read operation and the memory array 1905 is read by the read logic 1909 to develop the $D_{OUT}$ signal. At next block 2111, the digital processing block 1911 performs any digital processing that is necessary on the $D_{OUT}$ signal to further develop the digital output signal or the OTHER signals as necessary.

Figure 22:
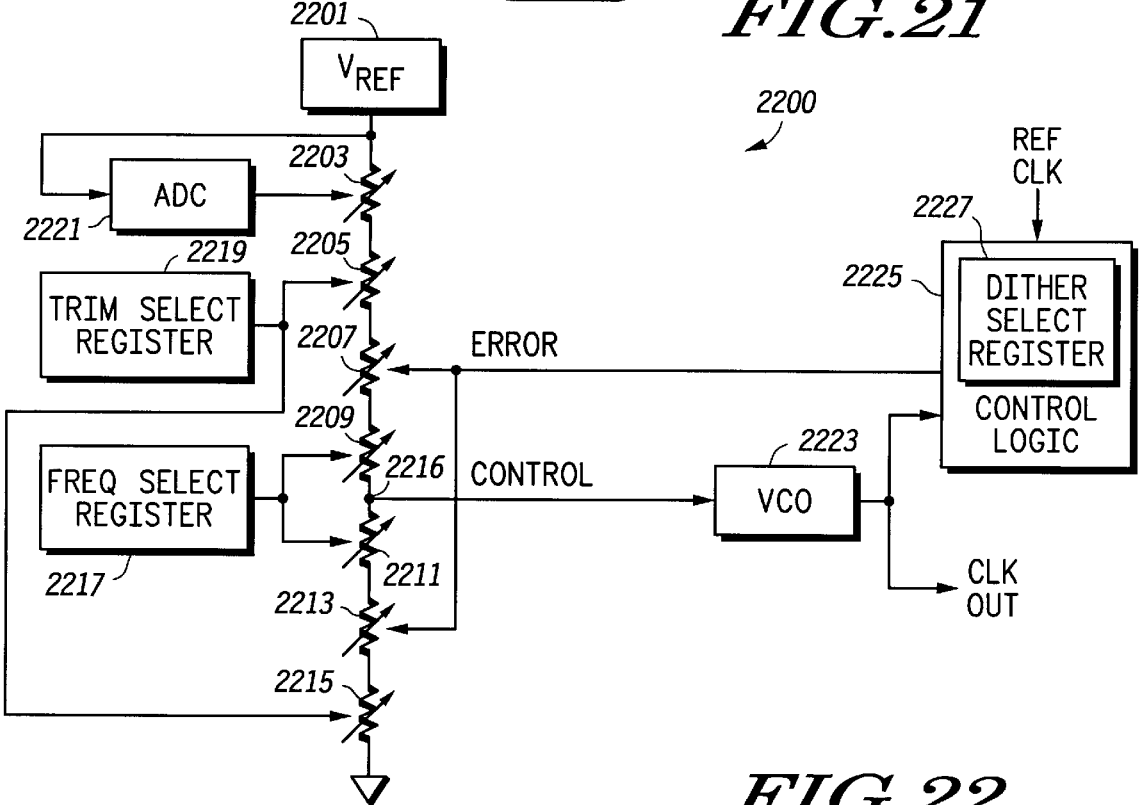
FIG. 22 is a schematic block diagram of a phase lock loop (PLL) circuit implemented using magnetoresistive memory technology.

FIG. 22 is a schematic block diagram of a phase lock loop (PLL) circuit 2200 implemented using magnetoresistive memory technology. A reference voltage source 2201 asserting a reference voltage signal $V_{REF}$ is coupled to one end of a memory array comprising a plurality of programmable resistors 2203, 2205, 2207, 2209, 2211, 2213 and 2215. The programmable resistors 2203–2215 are coupled between the $V_{REF}$ signal and ground and form a voltage divider junction 2216. Each of the programmable resistors 2203–2215 may be implemented in a similar manner as the programmable resistive circuits previously described utilizing one or more MRMEs, such as the programmable resistive circuits 500, 600. For the PLL circuit 2200, one or more pairs of the programmable resistors 2205–2215 each form a voltage divider circuit and may be implemented in a similar manner as the programmable voltage divider circuit 900.

In particular, the programmable resistors 2209 and 2211 form a first voltage divider on either side of the voltage junction 2216, where the resistor 2209 is an UPPER DIVIDER and the resistor 2211 is a LOWER DIVIDER. A frequency select register 2217 stores a frequency select value that is used to program the programmable resistors 2209 and 2211. The programmable resistors 2207 and 2213 form a second voltage divider on either side of the voltage junction 2216, where the resistor 2207 is an UPPER DITHERING and the resistor 2213 is a LOWER DITHERING programmable resistor. An ERROR signal serves as an error value that is used to program the programmable resistors 2207 and 2213. In an alternative embodiment, the error value could instead be used as the frequency select value to program the programmable resistors 2209, 2211, where the frequency select register 2217 and the resistors 2207 and 2213 are not needed. The programmable resistors 2205 and 2215 form a third voltage divider on either side of the voltage junction 2216, where the resistor 2205 is an UPPER TRIM and the resistor 2215 is a LOWER TRIM programmable resistor. A trim select register 2219 stores a trim value that is used to program the programmable resistors 2205 and 2215. The trim value may be preprogrammed into the trim select register 2219 for calibration.

The $V_{REF}$ signal is applied to the input of an analog-to-digital converter (ADC) 2221, having its output for controlling the programmable resistor 2203. In this manner, the ADC 2221 and the programmable resistor 2203 serve as a VOLTAGE COMPENSATOR to compensate for variations of the $V_{REF}$ signal. For example, if the $V_{REF}$ signal increases (or decreases), the resistance of the programmable resistor 2203 is increased (or decreased) by the ADC 2221 to maintain a constant voltage across the remaining portion of the series of programmable resistors 2205–2215. The ADC 2221 may be implemented in a similar manner as the ADC 1900.

The voltage junction 2216 develops a control voltage signal referred to as CONTROL, which is provided to an input of a voltage controlled oscillator (VCO) 2223. The VCO 2223 asserts an output clock signal CLK OUT in proportion to the control signal. The CLK OUT signal is provided to control logic 2225, which receives a reference clock signal REF CLK and which programs a dither select register 2227 within the control logic 2225. The dither select register 2227 is programmed with an error value measuring a phase differential between the CLK OUT and REF CLK signals. The error value in the dither select register 2227 is used to develop the ERROR signal that is provided to program the programmable resistors 2207 and 2213. The CLK OUT signal is typically several multiples greater in frequency than the REF CLK signal provided to the control logic 2227.

In operation, the frequency select register 2217 is programmed with a value representing a desired frequency of the CLK OUT signal. The CONTROL signal is developed at approximately the appropriate voltage level to the VCO 2223, which develops the CLK OUT signal at a frequency approximating the desired output frequency. The REF CLK signal provides a lower frequency reference to maintain and control the frequency of the CLK OUT signal. The control logic 2227 measures the phase differential and generates the ERROR signal indicative of the error of the CLK OUT signal. The ERROR signal adjusts the programmable resistors 2207 and 2213 to further adjust the CONTROL signal, which further adjusts the CLK OUT signal via the VCO 2223.

The trim select register 2219 stores the trim value that programs the programmable resistors 2205 and 2215 to adjust the operating point of the PLL circuit 2200. In one embodiment, the trim select register 2219 is preprogrammed at the factory in order to compensate for manufacturing variations or to calibrate the operating points. Alternatively, the trim select register 2219 may be preprogrammed by a purchaser of the PLL circuit 2200 to trim the circuit to a desired value for an overall system. Alternatively, the trim select register 2219 may be programmable in a system to shift the operating point of the PLL circuit 2200 during operation for calibration if desired.

Figure 23:
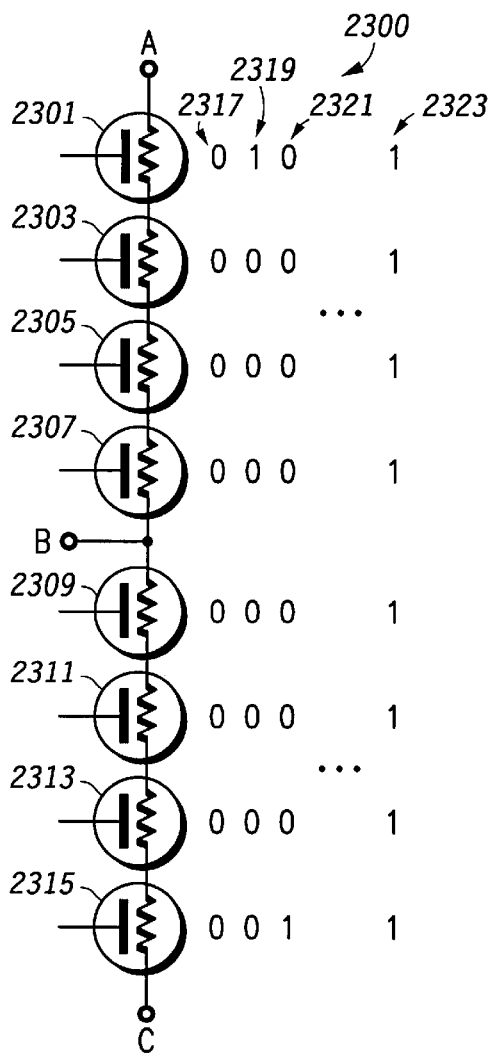
FIG. 23 is a schematic diagram of an exemplary voltage divider that may be utilized as any of the voltage dividers of the PLL circuit of FIG. 22.

FIG. 23 is a schematic diagram of a voltage divider 2300 that may be utilized as any of the voltage dividers described in reference to the PLL circuit 2200. In particular, a plurality of MRMEs 2301, 2303, 2305, 2307, 2309, 2311, 2313, and 2315 have their resistance values coupled in series between nodes A and C with an intermediate voltage junction at node B between MRMEs 2307 and 2309. In particular, the MRMEs 2301, 2303, 2305, and 2307 are coupled between nodes A and B to form a variable resistive circuit on one side of the voltage junction at node B and the MRMEs 2309, 2311, 2313, and 2315 are coupled between the nodes B and C to from another variable resistive circuit on the other side of node B. It is noted that although eight MRMEs 2301–2315 are shown, with an equal number of four MRMEs on either side of node B, it is understood that any number of MRMEs may be used to create the voltage divider and an equal or unequal number of MRMEs may be located on either side of the voltage junction B.

A plurality of states of the voltage divider 2300 are each represented by a column of logic values indicating the resistive state of each of the MRMEs 2301–2315. A first state 2317 is represented as a column of logic zeros in which the MRMEs 2301–2315 are all programmed to logic zero having resistance $R_0$. A next state 2319 is similar except that MRME 2301 is programmed to logic one having resistance value $R_1$. A next state 2321 is similar in that all of the MRMEs 2301–2313 are programmed to logic zero and where the MRME 2315 is programmed to logic one. A pattern of programming continues in similar fashion for successive states until a state 2323 in which all of the MRMEs 2301–2315 are programmed to logic one with a resistance of $R_1$. In this mode of operation, each of the states 2317–2323 has a different total resistance between nodes A and C ranging from $8R_0$ in state 2317 to $8R_1$ in state 2323. Some of the states may have the same overall resistance such as states 2319 and 2321 even though the resistance between nodes A and B and the resistance between nodes B and C changes to change the voltage at node B.

Figure 24:
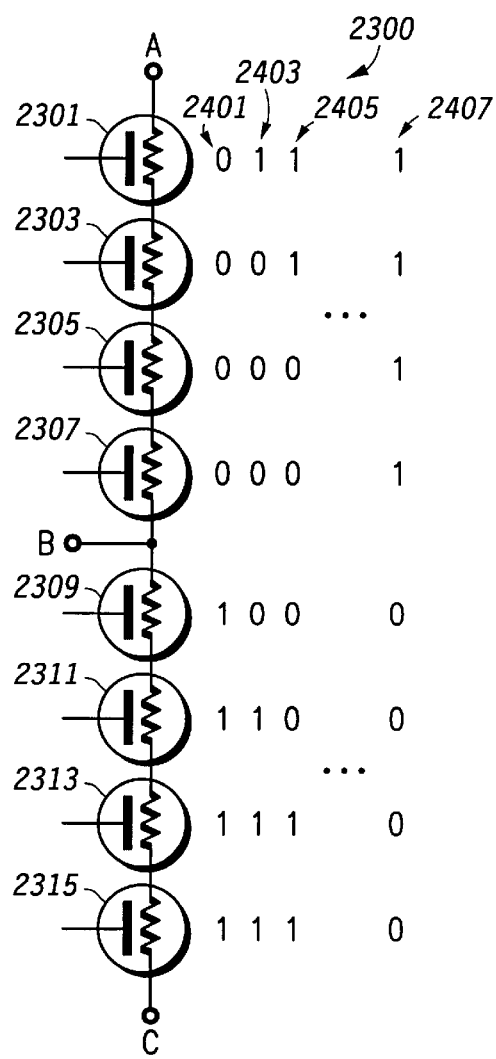
FIG. 24 is a schematic diagram of the voltage divider of FIG. 23 operated in a different mode to maintain a constant resistance from one programmable voltage to the next.

FIG. 24 is a schematic diagram of the voltage divider 2300 operated in a different mode to maintain a constant resistance between nodes A and C from one resistive state to the next. A plurality of states are shown 2401, 2403, 2405 . . . 2407 showing some and representing all of the states for this particular mode. Again, each state is represented by a column of logic values indicating the resistive state of each of the MRMEs 2301–2315. In state 2401, all of the MRMEs 2301–2307 of the upper programmable resistor are programmed with resistance value $R_0$ whereas the lower programmable resistor comprising MRMEs 2309–2315 are programmed with resistance value $R_1$. In this manner, the overall resistance between nodes A and C is $4R_0+4R_1$. In a next state 2403, the MRME 2301 is changed to resistance $R_1$ whereas the MRME 2309 is changed to resistance $R_0$ while the remaining MRMEs are unchanged. The overall resistance between nodes A and C for state 2403 is the same as the state 2401 or $4R_0+4R_1$. Nonetheless, the resistance of the upper resistance has increased whereas the lower resistance has decreased so that the voltage at node B is reduced. In next state 2405, the MRME 2303 is changed to resistance $R_1$ whereas the MRME is changed to resistance $R_0$. Again, the overall resistance between nodes A and C is $4R_0+4R_1$ while the voltage at node B is further reduced. In a final state 2407, all of the MRMEs 2301–2307 in the upper portion are programmed to resistance $R_1$ whereas the lower portion MRMEs 2309–2315 are programmed to resistance $R_1$. Again, the overall resistance between nodes A and C remains at $4R_0+4R_1$ and is the same as all of the other states 2401–2405. The voltage of node B is at a minimum in state 2407 and at a maximum in state 2401 for a given reference voltage asserted across nodes A and C.

It is appreciated that the voltage divider 2300 operated in constant total resistance mode as shown in FIG. 24 provides the benefit of increased accuracy by maintaining a constant impedance match between the resistive series array and a reference voltage while providing a programmable voltage.

Figure 25:
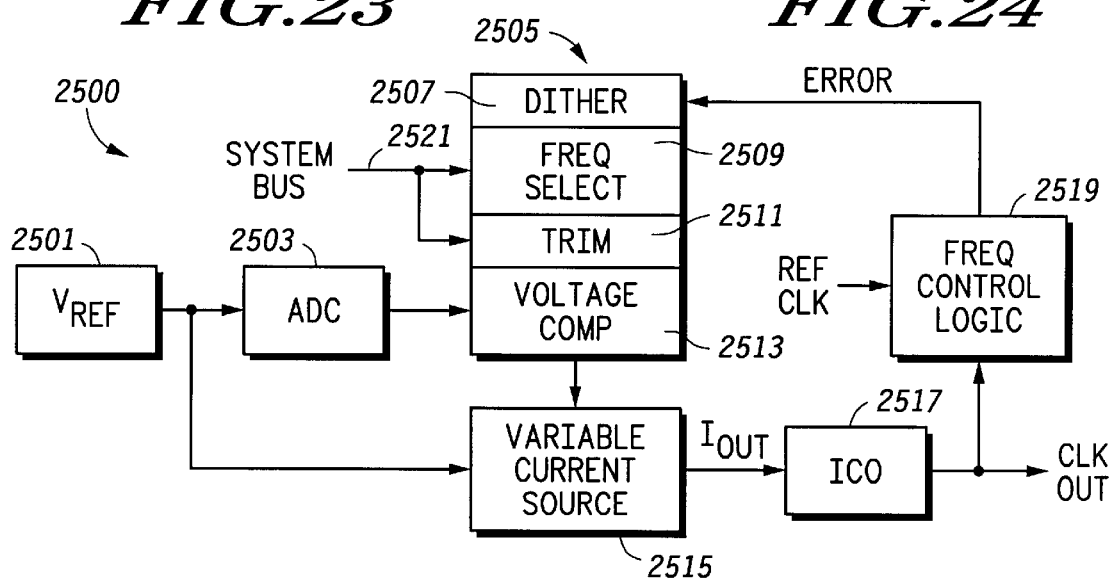
FIG. 25 is a block diagram of PLL circuit according to an alternative embodiment using magnetoresistive memory technology and a current-controlled oscillator.

FIG. 25 is a block diagram of another PLL circuit 2500 utilizing a current controlled oscillator (ICO) 2517 that replaces the VCO 2223. The PLL circuit 2500 includes a reference voltage source 2501 that provides a voltage reference signal $V_{REF}$ to an analog-to-digital converter (ADC) 2503 and to a variable current source 2515. The ADC 2503 may be implemented in a similar manner as the ADC 1900 previously described utilizing magnetoresistive memory elements or MRMEs. The variable current source 2515 may be implemented in a similar manner as the programmable current sources 700 or 800 previously described utilizing magnetoresistive memory elements or MRMEs.

The output of the ADC 2503 is provided to a voltage compensation portion 2513 of a programmable circuit 2505. The programmable circuit 2505 includes a plurality of control circuitry, logic and memory, such as registers or the like, for storing static and programmable digital values that are used to program the variable current source 2515. The programmable circuit 2505 may also comprise magnetoresistive memory elements or MRMEs. The variable current source 2515 asserts a corresponding current output $I_{OUT}$ to the ICO 2515, which generates a corresponding output clock signal CLK OUT. The CLK OUT signal is detected by frequency control logic 2519, which also receives a reference clock signal REF CLK. The frequency control logic 2519 asserts an error value referred to as ERROR to a dither portion 2507 of the programmable circuit 2505. A frequency select portion 2509 and a trim portion 2511 of the programmable circuit 2505 are programmable via a system bus 2521.

Operation of the PLL circuit 2500 is similar to the PLL circuit 2200. The dither, frequency select, trim and voltage compensation portions 2507, 2509, 2511, 2513 each include respective values that are provided as a collective value to program the variable current source 2515 on a periodic basis or continuous basis. The trim portion 2511 may be pre-programmed by a manufacturer, by a purchaser of the PLL circuit 2500 or may be programmable during operation in a similar manner as described previously for the trim select register 2219. The trim portion 2511 may thus be a static or dynamic value to adjust the operating point of the PLL circuit 2500. The voltage source 2501 provides the primary reference voltage $V_{REF}$ for the variable current source 2515 to determine the magnitude of the $I_{OUT}$ signal to the ICO 2517. The ADC 2503 and the voltage compensation portion 2513 of the programmable circuit 2505 provide compensation for variations of the $V_{REF}$ signal in a similar manner as previously described for the ADC 2221 and the programmable resistor 2203 of the PLL circuit 2200. The voltage compensation portion 2513 may include a predetermined static value and further includes a dynamic portion to track any changes of the $V_{REF}$ signal.

The frequency select portion 2509 is programmed with a digital frequency select value to determine the desired frequency of the CLK OUT signal. The collective value from the programmable circuit 2505 programs the variable current source 2515 on a periodic or continuous basis. The variable current source 2515 asserts the $I_{OUT}$ signal according to the collective value. The frequency control logic 2519 detects any phase differential between the REF CLK and CLK OUT signals and asserts the ERROR signal to adjust the dither portion 2507. In this manner, the CLK OUT signal is maintained at the desired frequency and in phase with the REF CLK signal.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Although the invention has been described with respect to specific conductivity types or polarity of potentials, skilled artisans appreciated that conductivity types and polarities of potentials may be reversed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A magnetoresistive memory array, comprising:
    a plurality of multi-state magnetoresistive memory elements coupled into a memory array, the memory array having an easy axis and a hard axis;
    at least one first memory line coupled within a predetermined range of a first subset of the plurality of multi-state magnetoresistive memory elements along the easy axis, the first subset including at least two memory elements; and
    a first current source, coupled to the at least one first memory line, that includes a first state capable of applying a first current level that generates a magnetic field that is independently sufficient to program the logic state of each of the multi-state magnetoresistive memory elements in the first subset.

2. The magnetoresistive memory array of claim 1, further comprising:
    the first current source including a second state, the second state capable of applying a second current level that generates a magnetic field that is insufficient alone to program the logic state of any of the multi-state magnetoresistive memory elements in the first subset;
    a second memory line coupled within a predetermined range of a second subset of the plurality of multi-state magnetoresistive memory elements along the hard axis, the second memory line including at least one of the multi-state magnetoresistive memory elements of the first subset; and
    a second current source, coupled to the second memory line, that applies a third current level along the second memory line;
    the second current level of the first current source and the third current level of the second current source sufficient to program the logic state of the at least one multi-state magnetoresistive memory element in both the first and second subsets.

3. The magnetoresistive memory array of claim 1, further comprising:
    a plurality of first memory lines, each coupled within a predetermined range of a corresponding one of a plurality of subsets of the plurality of multi-state magnetoresistive memory elements along the easy axis; and
    a plurality of first current sources, each coupled to a corresponding one of the plurality of first memory lines, each including a first state capable of applying the first current level that generates a magnetic field that is independently sufficient to program the logic state of each of the multi-state magnetoresistive memory elements in a corresponding one of the plurality of subsets.

4. The magnetoresistive memory array of claim 3, further comprising:
    the plurality of first memory lines comprising a plurality of column memory lines;
    the plurality of first current sources comprising a plurality of column current sources, each column current source including a second state that is capable of applying a second current level that generates a magnetic field along a corresponding column memory line that is insufficient alone to program the logic state of any of the multi-state magnetoresistive memory elements in the corresponding column memory line;
    a plurality of row memory lines along the hard axis, each row memory line coupled within a second predetermined range of a corresponding one of a plurality of rows of the plurality of multi-state magnetoresistive memory elements; and
    a plurality of row current sources, each coupled to a corresponding one of the plurality of row memory lines and each capable of applying a third current level along a corresponding row line;
    the second current level of each column current source and the third current level of each row current source sufficient to program the logic state of any common multi-state magnetoresistive memory elements.

5. The magnetoresistive memory array of claim 4, further comprising:
    control logic that programs the magnetoresistive memory array in one write operation;
    the control logic controlling at least one column current source into the first state to program multi-state magnetoresistive memory elements in corresponding column memory lines;
    the control logic controlling at least one column current source into the second state to program multi-state magnetoresistive memory elements in at least one partial column memory line; and
    the control logic controlling at least one row current source into the third state to program common multi-state magnetoresistive memory elements in the at least one partial column memory line.

6. A magnetoresistive memory array, comprising:
    a memory array having a hard axis and an easy axis, the memory array including a plurality of column memory lines along the easy axis and a plurality of row memory lines along the hard axis;
    a plurality of multi-state magnetoresistive memory elements organized into the memory array, each memory element coupled within a first predetermined range of a corresponding column memory line and thus along the corresponding column memory line and within a second predetermined range of a corresponding row memory line and thus along the corresponding row memory line, each column memory line including at least two memory elements;

column drive circuitry, coupled to the plurality of column memory lines, configured to independently program the memory elements along any column memory line into either of first and second logic states; and row drive circuitry, coupled to the plurality of row memory lines, configured to program, when utilized in combination with the column drive circuitry, the memory elements along any row memory line into either of the first and second logic states.

7. The magnetoresistive memory array of claim 6, further comprising:

the column drive circuitry including a first plurality of column drivers and a second plurality of column drivers, each of the first and second plurality of column drivers coupled to a corresponding one of the plurality of column memory lines;

each of the first plurality of column drivers having a first drive state that is sufficient to program any of the multi-state magnetoresistive memory elements in the corresponding column memory line into the first logic state only in combination with the row drive circuitry and a second drive state that is sufficient to independently program the memory elements along the corresponding column memory line into the first logic state; and each of the second plurality of column drivers having a third drive state that is sufficient to program any of the multi-state magnetoresistive memory elements in the corresponding column memory line into the second logic state only in combination with the row drive circuitry and a fourth drive state that is sufficient to independently program the memory elements along the corresponding column memory line into the second logic state.

8. The magnetoresistive memory array of claim 7, further comprising:

the first plurality of column drivers each including first and second current drivers, the first current driver activated in the first drive state and the second current driver activated in the second drive state; and the second plurality of column drivers each including first and second current drivers, the first current driver activated in the third drive state and the second current driver activated in the fourth drive state.

9. A method of programming a magnetoresistive memory array, the magnetoresistive memory array including a plurality of multi-state magnetoresistive memory elements in a memory array, the memory array including an easy axis and a hard axis and a memory line coupled within the predetermined range to a subset of the plurality of multi-state magnetoresistive memory elements along the easy axis, the method comprising:

applying a current along the memory line that generates a magnetic field to a first level that is independently sufficient to program all of the multi-state magnetoresistive memory elements coupled within the predetermined range to the memory line; and reducing the current generated magnetic field below the first level to a second level that is insufficient alone to program any of the multi-state magnetoresistive memory elements coupled within the predetermined range to the memory line.

10. The method of claim 9, the memory array including a plurality of first memory lines, each coupled within a predetermined range of a corresponding one of a plurality of subsets of the plurality of multi-state magnetoresistive memory elements along the easy axis, the method further comprising:

applying a current along each of the plurality of first memory lines that generates a magnetic field on each memory line that is independently sufficient to program the logic state of each of the multi-state magnetoresistive memory elements in each of the plurality of subsets.

11. The method of claim 10, the plurality of first memory lines comprising a plurality of column memory lines, the memory array further including a plurality of row memory lines along the hard axis, each row memory line coupled within a second predetermined range of a corresponding one of a plurality of rows of the plurality of multi-state magnetoresistive memory elements, the method further comprising:

applying a respective high current along at least one column memory line that generates a respective magnetic field that is independently sufficient to program all of the multi-state magnetoresistive memory elements coupled within the predetermined range of the at least one column memory line;

applying a respective medium current along at least one other column memory line that generates a corresponding magnetic field that is sufficient to program all of the multi-state magnetoresistive memory elements coupled within the predetermined range of the at least one other column memory line only in combination with a current applied along the hard axis along a corresponding row memory line; and applying a current along at least one row memory line to program all of the multi-state magnetoresistive memory elements coupled within the predetermined range of the at least one other column memory line and within the second predetermined range of the at least one row memory line.

\* \* \* \* \*